United States Patent
Tsuruda et al.

(10) Patent No.: US 8,455,183 B2
(45) Date of Patent: Jun. 4, 2013

(54) RESIST PATTERN SLIMMING TREATMENT METHOD

(75) Inventors: Toyohisa Tsuruda, Koshi (JP); Yoshihiro Kondo, Koshi (JP); Atsushi Ookouchi, Koshi (JP); Masahiro Yamamoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 307 days.

(21) Appl. No.: 12/662,632

(22) Filed: Apr. 27, 2010

(65) Prior Publication Data

US 2010/0291490 A1 Nov. 18, 2010

(30) Foreign Application Priority Data

May 15, 2009 (JP) .................................. 2009-119088

(51) Int. Cl.
*G03F 7/26* (2006.01)

(52) U.S. Cl.
USPC ......................................................... 430/325

(58) Field of Classification Search
USPC .......................................... 430/325, 315, 324
See application file for complete search history.

(56) References Cited

U.S. PATENT DOCUMENTS

| | | | |
|---|---|---|---|
| 2004/0137378 A1* | 7/2004 | Sugeta et al. | 430/325 |
| 2005/0175926 A1* | 8/2005 | Sugeta et al. | 430/270.1 |
| 2005/0245663 A1* | 11/2005 | Sugeta et al. | 524/459 |
| 2006/0079628 A1* | 4/2006 | Sugeta et al. | 524/503 |
| 2007/0068451 A1* | 3/2007 | Nomura | 118/58 |

FOREIGN PATENT DOCUMENTS

| | | |
|---|---|---|
| JP | A-2001-281886 | 10/2001 |
| JP | A-2002-057084 | 2/2002 |
| JP | A-2002-299202 | 10/2002 |
| JP | A-2003-124105 | 4/2003 |
| JP | A-2003-215814 | 7/2003 |
| JP | A-2007-094058 | 4/2007 |

OTHER PUBLICATIONS

Office Action mailed Aug. 9, 2011 in corresponding JP application No. 2009-119088 (and English translation).

* cited by examiner

*Primary Examiner* — Kathleen Duda
*Assistant Examiner* — Caleen Sullivan
(74) *Attorney, Agent, or Firm* — Posz Law Group, PLC

(57) ABSTRACT

A resist pattern slimming treatment method includes: a slimming treatment step of performing a slimming treatment on a resist pattern by applying a solution containing an acid onto a substrate having the resist pattern formed thereon, then performing a heat treatment, and then performing a developing treatment. A database storing kinds of resist material for the resist pattern, concentrations of acid contained in a solution to be applied onto the substrate having the resist pattern formed thereon, and line widths of the resist pattern corresponding to the kinds of resist material and the concentrations of acid is prepared in advance. The concentration of the acid contained in the solution used in the slimming treatment step is based on a concentration of the acid obtained from the database, using, as search keys, the kind of resist material and a target value of the line width of the resist pattern.

3 Claims, 19 Drawing Sheets

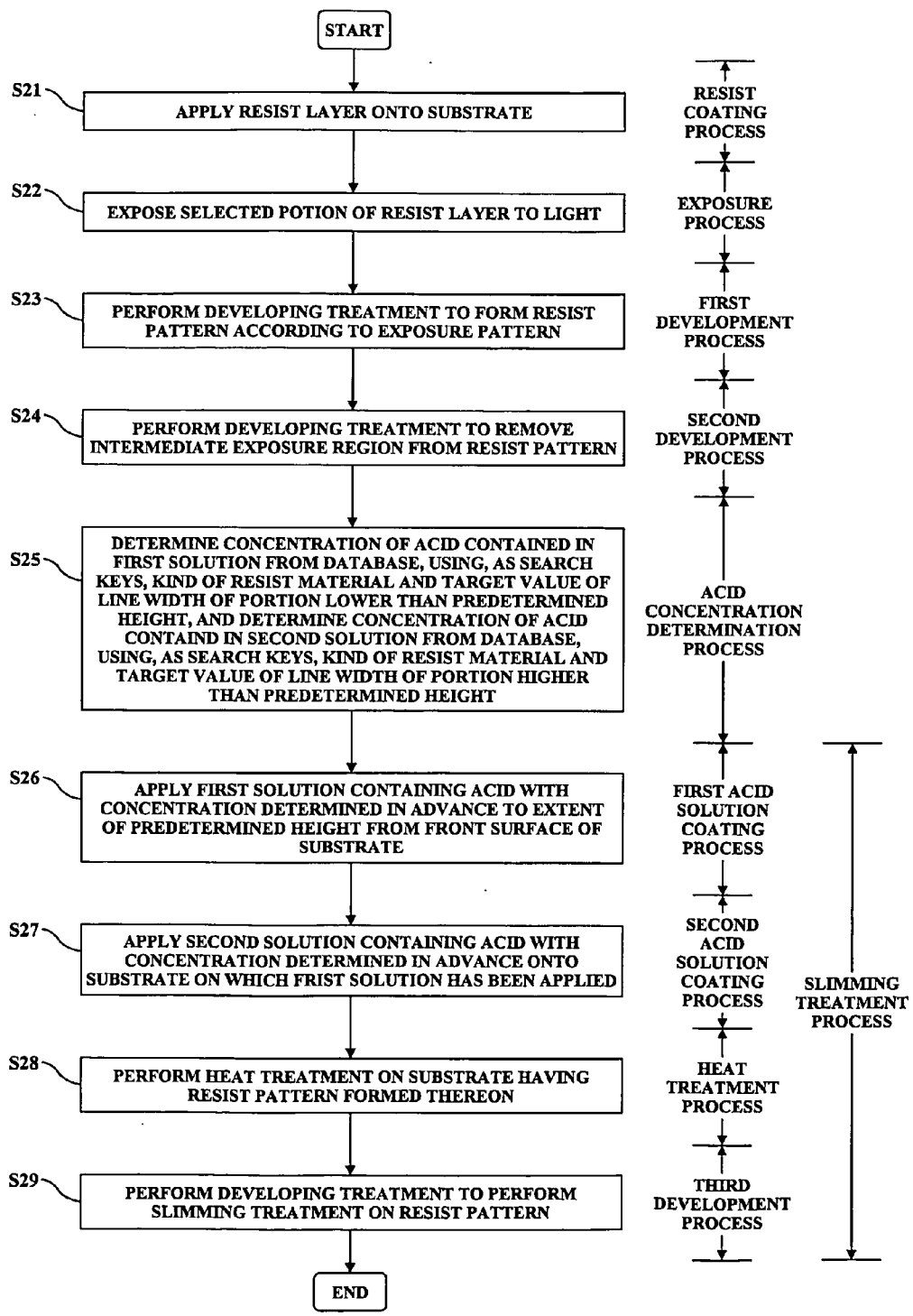

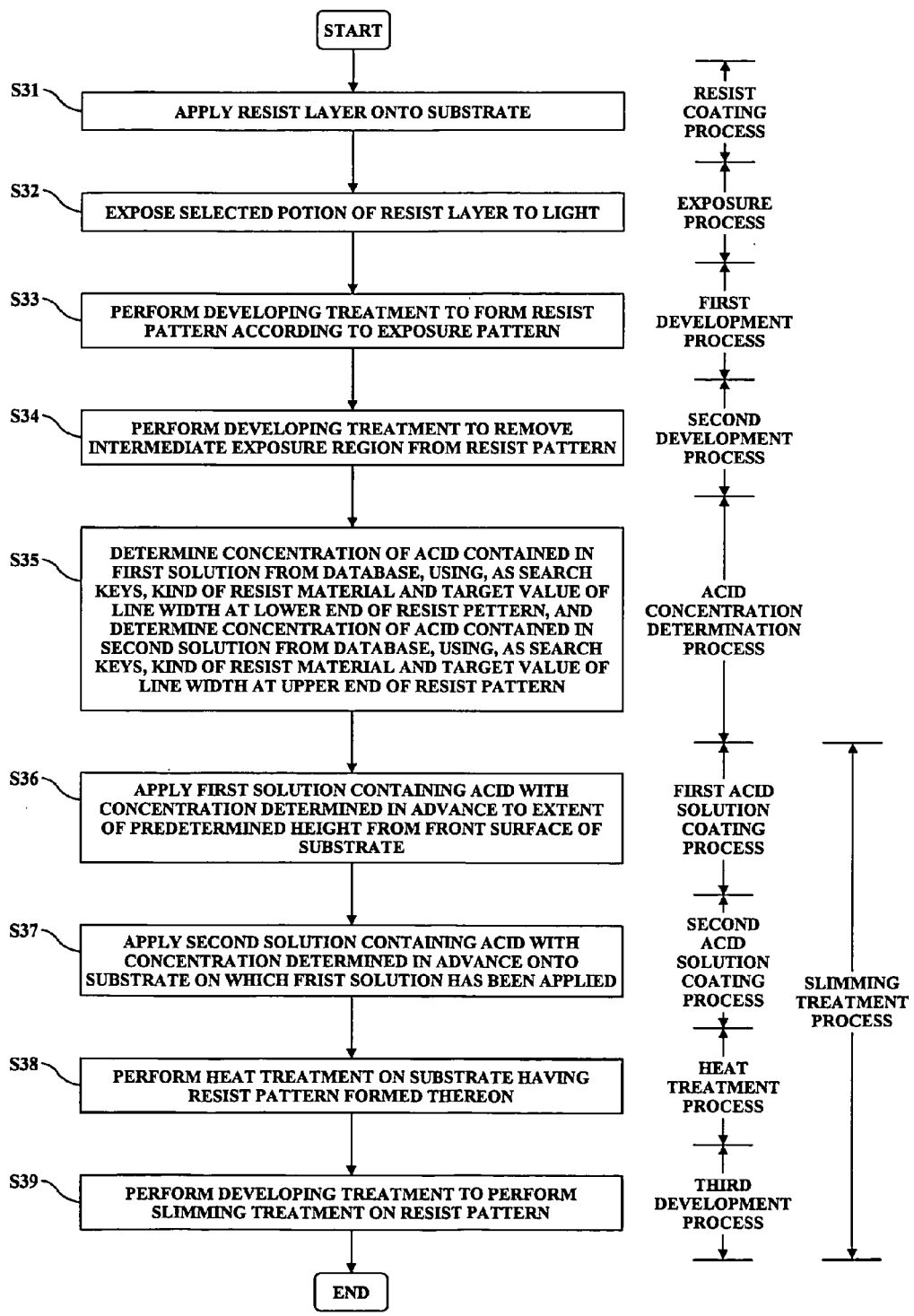

RESIST PATTERN SLIMMING TREATMENT METHOD

BACKGROUND OF THE INVENTION

1. Field of the Invention

The present invention relates to a resist pattern slimming treatment method of performing a slimming treatment on a resist pattern formed on a substrate, in a semiconductor process or the like.

2. Description of the Related Art

With increased miniaturization of semiconductor devices, it has become more difficult to secure a sufficient exposure contrast of a fine pattern having a ratio between the line width and the space width being 1:1 only by using optical exposure technology. Hence, a technique of forming a fine pattern by combining a new layer to a pattern or a technique of forming a fine pattern by performing the pattern formation in two steps has been discussed. However, it is important in any of the techniques how to form a reduced line width of the pattern. Examples of a slimming treatment method that is a method of the treatment in which a series of photolithography composed of resist coating, heat treatment, exposure processing and developing treatment is performed to form a resist pattern on a substrate, and then the line width of the formed resist pattern is reduced (hereinafter, referred to as a "slimming treatment"), include the following ones.

There is a method in which a resist pattern is formed using a chemically amplified resist, and then an acid coating is applied on the resist pattern so that a surface layer of the resist pattern changes to be alkali-soluble, and the surface layer changed to be alkali-soluble is removed, whereby the line width of the resist pattern is made smaller than the line width that has been formed first (see, for example, Japanese Patent Application Laid-open No. 2001-281886).

There is another method in which a resist pattern is formed using a chemically amplified resist, then a modifying material containing acid is applied onto the resist pattern and diffused into the resist pattern, and thereafter the modifying material and a portion of the resist pattern which has been made soluble by diffusion of the modifying material are removed, whereby the line width of the resist pattern is made smaller than the line width that has been formed first (see, for example, Japanese Patent Application Laid-open No. 2002-299202).

There is still another method in which a resist pattern is formed, then a pattern thinning material (shrinking material) is applied onto the resist pattern to form a pattern mixing layer on the front surface of the resist pattern, and thereafter the thinning material and the pattern mixing layer are removed, whereby the line width of the resist pattern is made smaller than the line width that has been formed first (see, for example, Japanese Patent Application Laid-open No. 2003-215814).

SUMMARY OF THE INVENTION

However, when reducing the line width of the resist pattern using the above-described slimming treatment method, there is a following problem.

The problem is that when a solution containing acid is applied onto a resist pattern, and a heat treatment is performed on the substrate to diffuse the acid from the surface of the resist to the inside of the resist so that the acid reacts with the resist, the speed of the acid diffusing to the inside of the resist and the rate of the acid reacting with the resist may differ for each resist material forming the resist pattern. Therefore, it is impossible to stabilize the amount of reduction in line width (a slim amount) of the resist pattern by the slimming treatment, for resist patterns made of various kinds of resist materials.

When the rate of the resist material reacting with the acid is high, the reaction may excessively proceed even if the temperature of the heat treatment is decreased to a temperature at the lower limit in a settable range. Besides, when the rate of the resist material reacting with the acid is low, the reaction may rarely proceed even if the temperature of the heat treatment is increased to a temperature at the upper limit in the settable range. Because of restraints on the upper and lower limits in the settable range of the temperature of the heat treatment, it is sometimes impossible to eliminate the difference in slim amount caused by the difference between resist materials, only by changing the temperature of the heat treatment.

Conditions (variables) other than the temperature of the heat treatment to control the slim amount in the slimming treatment include the heat treatment time, the developing treatment time, the concentration of the developing solution and so on. However, even if the concentration of the developing solution is changed, the slim amount itself cannot be changed. Besides, a change of the heat treatment time or the developing treatment time can decrease the number of treated substrates (throughput) per unit time when performing the slimming treatment on the substrates, and is not a practical method.

The present invention has been made in consideration of the above points, and an object thereof is to provide a resist pattern slimming treatment method capable of obtaining a fixed slim amount irrespective of the kind of resist material.

To solve the above problem, the present invention is characterized by devising the means described below.

The present invention is a resist pattern slimming treatment method of performing a slimming treatment on a resist pattern formed on a substrate, including: a slimming treatment step of performing a slimming treatment on the resist pattern by applying a solution containing an acid onto the substrate having the resist pattern formed thereon, then performing a heat treatment, and then performing a developing treatment, wherein a database storing kinds of resist material for the resist pattern, concentrations of acid contained in a solution to be applied onto the substrate having the resist pattern formed thereon, and line widths of the resist pattern corresponding to the kinds of resist material and the concentrations of acid is prepared in advance, and wherein the concentration of the acid contained in the solution used in the slimming treatment step is based on a concentration of the acid obtained from the database, using, as search keys, the kind of resist material and a target value of the line width of the resist pattern.

The present invention according to another aspect is a resist pattern slimming treatment method of performing a slimming treatment on a resist pattern formed on a substrate, including: a slimming treatment step of performing a slimming treatment on the resist pattern by applying a first solution containing an acid onto the substrate having the resist pattern formed thereon to an extent of a predetermined height from a front surface of the substrate, then applying a second solution containing an acid with a concentration higher than a concentration of the acid contained in the first solution, onto the substrate on which the first solution has been applied, then performing a heat treatment, and then performing a developing treatment, wherein a database storing kinds of resist material for the resist pattern, concentrations of acid contained in a solution to be applied onto the substrate having the resist pattern formed thereon, and line widths of the resist pattern corresponding to the kinds of resist material and the concentrations of acid is prepared in advance, wherein the concentration of the acid contained in the first solution used in the slimming treatment step is based on a concentration of the acid obtained from the database, using, as search keys, the kind of resist material and a target value of the line width of a portion of the resist pattern lower than the predetermined height from the front surface of the substrate, and wherein the concentration of the acid contained in the second solution used in the slimming treatment step is based on a concentration of the acid obtained from the database, using, as search keys, the kind of resist material and a target value of the line width of a portion of the resist pattern higher than the predetermined height from the front surface of the substrate.

According to the present invention, a fixed slim amount can be obtained irrespective of the kind of resist material in performing a slimming treatment on a resist pattern.

BRIEF DESCRIPTION OF THE DRAWINGS

FIG. 12 is a flowchart for explaining a procedure of processes of a resist pattern slimming treatment method and a resist pattern forming method according to a second embodiment of the present invention;

FIG. 15 is a flowchart for explaining a procedure of processes of a resist pattern slimming treatment method and a resist pattern forming method according to a modification example of the second embodiment of the present invention;

DETAILED DESCRIPTION OF THE INVENTION

Embodiments for implementing the present invention will be described below with reference to the drawings.

First Embodiment

At the beginning, a resist pattern slimming treatment method and a coating and developing apparatus used for performing the slimming treatment method, which are a first embodiment of the present invention, will be described with reference to FIG. 1 to FIG. 11.

First, the coating and developing apparatus according to this embodiment will be described with reference to FIG. 1 to FIG. 4.

Figure 1:
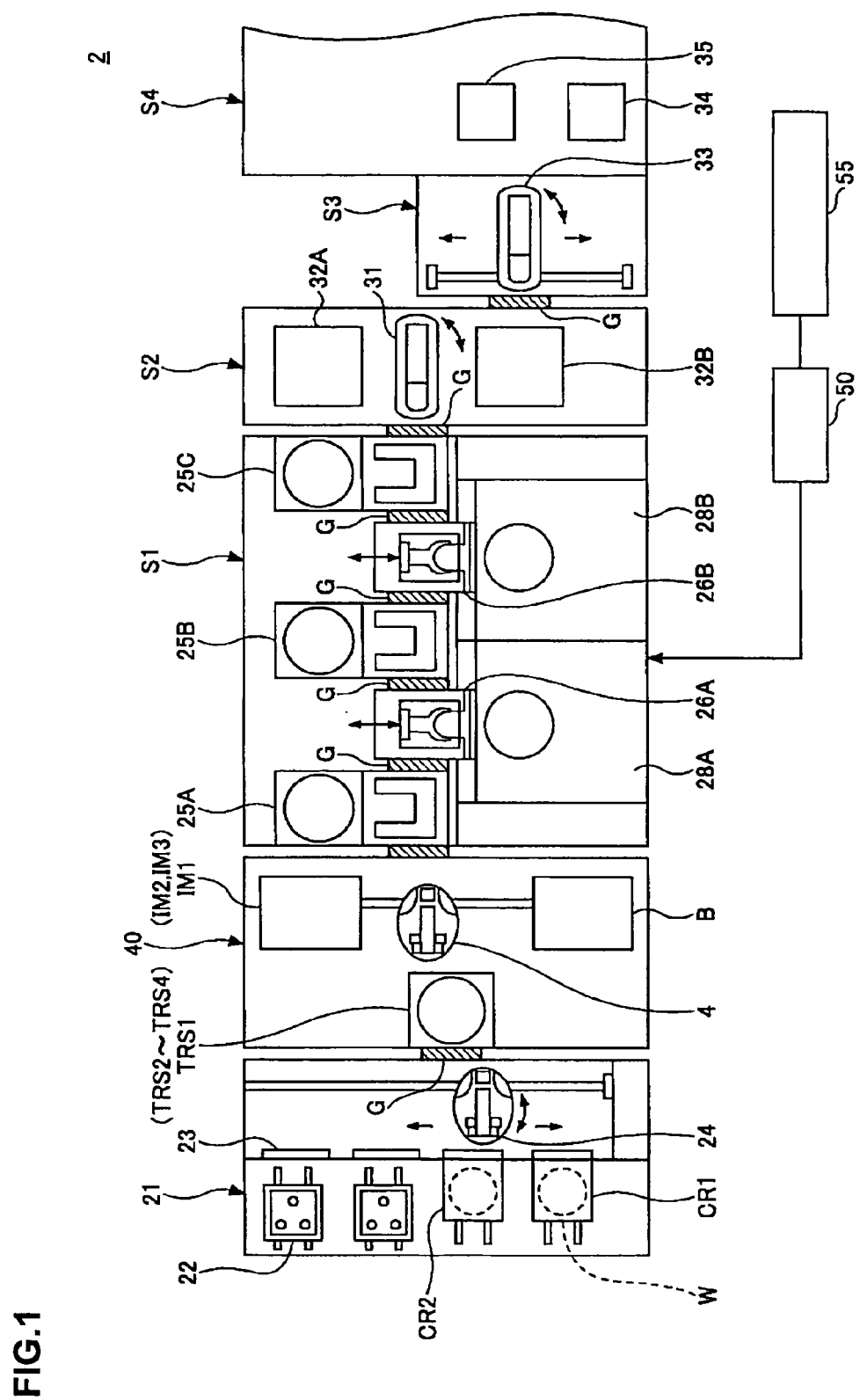
FIG. 1 is a plan view showing the overall configuration of a coating and developing apparatus according to a first embodiment of the present invention.
Figure 2:
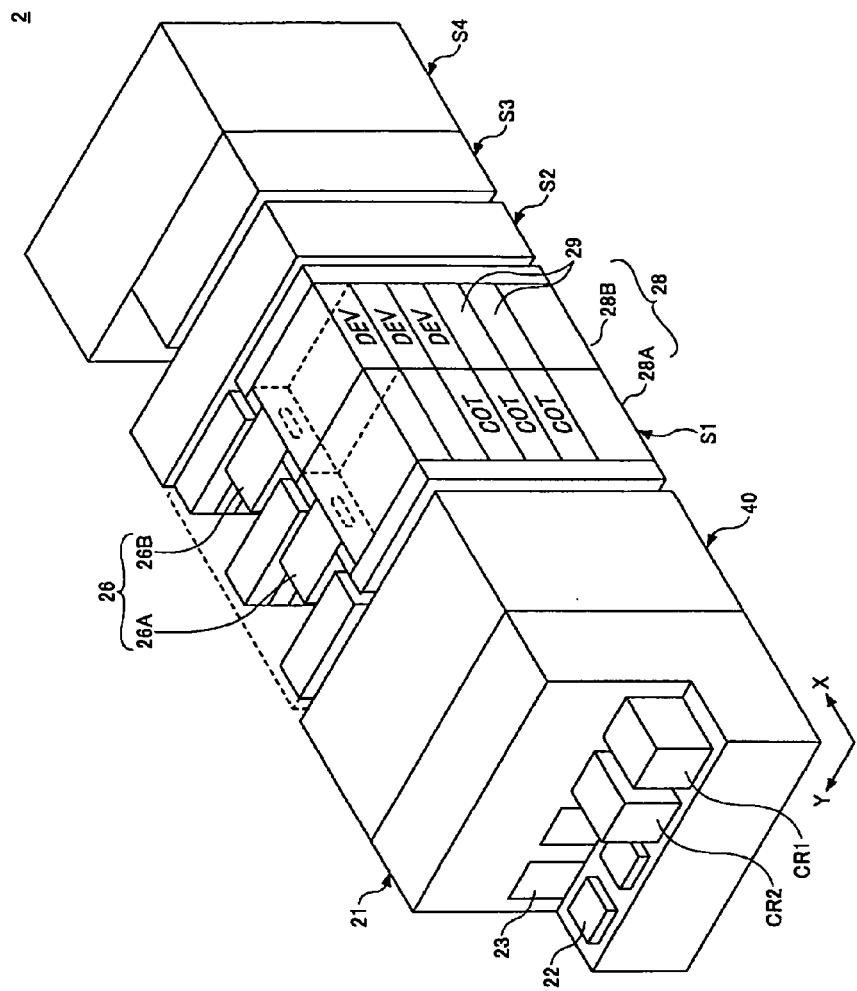
FIG. 2 is a perspective view showing the overall configuration of the coating and developing apparatus according to the first embodiment of the present invention.
Figure 3:
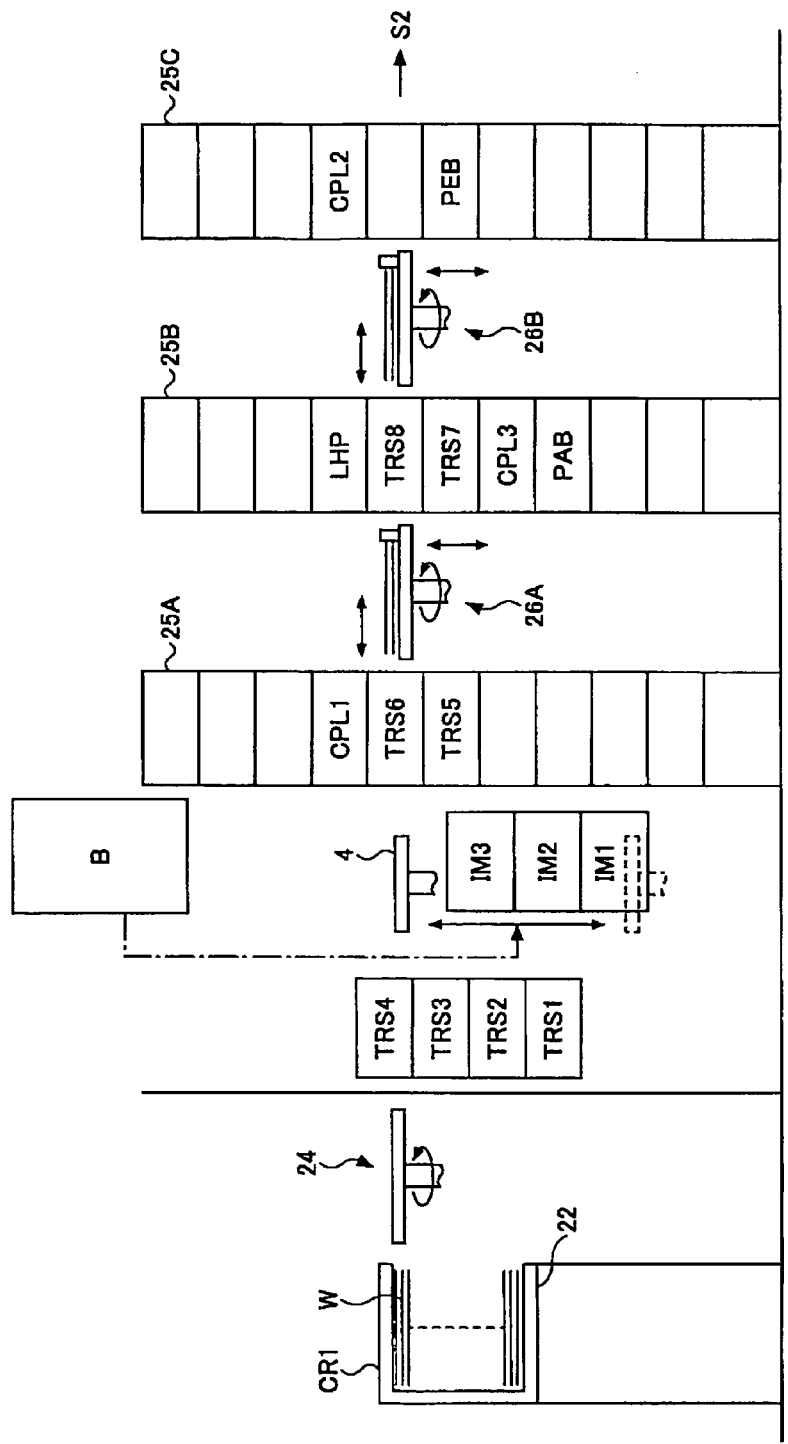
FIG. 3 is a longitudinal side view of the coating and developing apparatus according to the first embodiment of the present invention.
Figure 4:
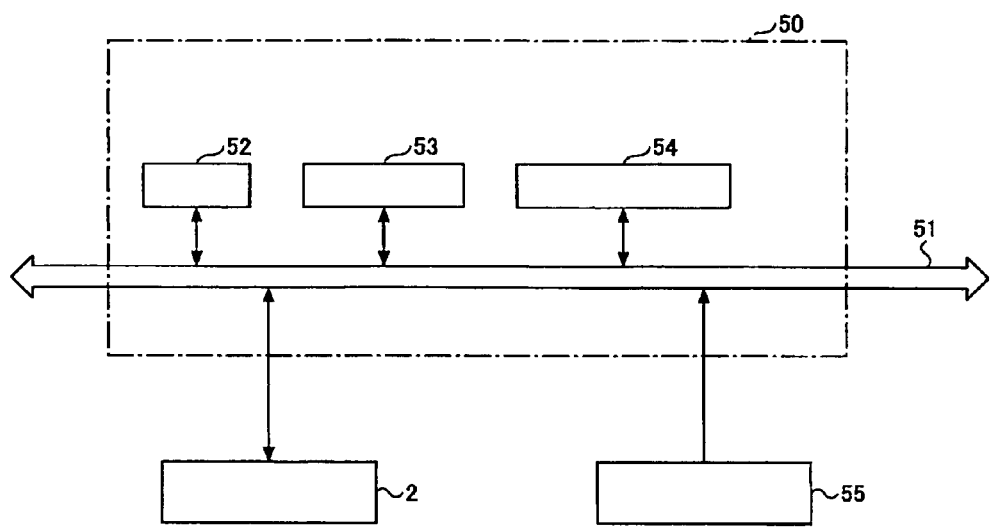
FIG. 4 is a configuration diagram of a control unit of the coating and developing apparatus according to the first embodiment of the present invention.

FIG. 1 is a plan view showing the overall configuration of the coating and developing apparatus according to this embodiment. FIG. 2 is a perspective view showing the overall configuration of the coating and developing apparatus according to this embodiment. FIG. 3 is a longitudinal side view of the coating and developing apparatus according to this embodiment. FIG. 4 is a configuration diagram of a control unit of the coating and developing apparatus according to this embodiment.

As shown in FIG. 1 and FIG. 2, a coating and developing apparatus 2 has a carrier block 21, an inspection block 40, a treatment block S1, a first interface block S2, a second interface block S3, and an aligner S4, in order from the front side (the negative direction side in an X-direction in FIG. 2). In the carrier block 21, a plurality of carriers CR1 and CR2 housing wafers W are mounted. To the back side of the carrier block 21 (the positive direction side in the X-direction in FIG. 2), the inspection block 40 and the treatment block S1 that are surrounded by respective casings are connected in this order. To the back side of the treatment block S1, the aligner S4 is connected via the first interface block S2 and the second interface block S3.

In the carrier block 21, a mounting section 22 for mounting the plurality of carriers CR1 and CR2 thereon, opening/closing units 23 provided in a forward wall surface as viewed from the mounting section 22, and a delivery arm 24 that is a delivery means for taking wafers W out of the carriers CR1 and CR2 via the opening/closing units 23, are provided. The delivery arm 24 is configured to freely lift up and down, move right and left and back and forth, and rotate around the vertical axis. The delivery arm 24 is controlled based on a command from a later-described control unit 50.

In each of the carriers CR1 and CR2, for example, 25 wafers W being substrates that will be subjected to coating and developing treatments are housed. The carrier CR1 housing the wafers W that will be subjected to the coating and developing treatments and the carrier CR2 housing the wafers W that will not be subjected to the coating and developing treatments but only to inspection are transferred in/out by a not-shown transfer mechanism from/to the outside of the coating and developing apparatus 2.

As shown in FIG. 3, the inspection block 40 includes: four delivery stages TRS1 to TRS4; inspection modules IM1 to IM3; a transfer arm 4 being a substrate transfer means delivering the wafer W between the delivery stages TRS1 to TRS4, the inspection modules IM1 to IM3, and delivery stages TRS5 and TRS6 in the treatment block S1; and a buffer module B temporarily storing the wafer W transferred from the treatment block S1 into the inspection block 40. The delivery stages TRS1 to TRS4 that are first to fourth stages are vertically stacked as shown in FIG. 3. Further, the inspection modules IM1 to IM3 are also vertically stacked.

The inspection module IM1 is a film thickness and line width inspection module measuring the thickness of a film formed on the wafer W and the line width of a pattern. As the film thickness and line width inspection module, for example, an optical digital profilometry (ODP) system including scatterometry can be used.

Besides, as the inspection module IM2, a macro inspection module detecting macro defects on the wafer W can be provided. Alternatively, as the inspection module IM3, an overlay inspection module detecting overlay misalignment of exposure, that is, the displacement between the formed pattern and an underlying pattern can be provided.

As shown in FIG. 1 and FIG. 3, in the treatment block S1, three shelf modules 25A, 25B, and 25C in each of which modules of a heating and cooling system are multi-tiered, and two main arms 26A and 26B that are main transfer means for delivering the wafer W between later-described solution treatment modules, are provided such that they are alternately arranged in order from the front side. Each of the main arms 26A and 26B includes two arms which are configured to freely lift up and down, move right and left and back and forth, and rotate around the vertical axis. Each of the main arms 26A and 26B is controlled based on a command from the later-described control unit 50.

The shelf modules 25A, 25B, and 25C and the main arms 26A and 26B are arranged one behind the other in a line as view from the side of the carrier block 21, and a not-shown opening portion for wafer transfer is formed in each connection region G. Therefore, the wafer W can be freely moved in the treatment block S1 from the shelf module 25A on one end side to the shelf module 25C on the other end side. Further, each of the main arms 26A and 26B is placed in a space surrounded by a partition wall composed of face portions on the side of the shelf modules 25B, and 25A or 25C which are arranged in a forward and backward direction as viewed from the carrier block 21, one face portion on the side of, for example, the solution treatment unit on the right side, and a rear face portion forming one face of the treatment block S1 on the left side.

As shown in FIG. 2, at positions where the wafers W are delivered by the main arms 26A and 26B, solution treatment modules 28A and 28B in each of which solution treatment units such as coating modules COT applying a resist and developing units DEV are multi-tiered are provided. Each of the solution treatment modules 28A and 28B is configured such that treatment containers 29 housing the solution treatment units therein are stacked at a plurality of, for example, five tiers.

Further, in the shelf modules 25A, 25B, and 25C, delivery stages TRS5 to TRS8 for delivering the wafer W, a heating module LHP forming heating units for performing a heating treatment on the wafer W after application of a developing solution, cooling modules CPL1, CPL2, and CPL3 forming cooling units for performing a cooling treatment on the wafer W before and after application of the resist solution and before the developing treatment, a heating module PAB being a heating unit performing a heating treatment on the wafer W before exposure processing, and a heating module PEB forming a heating unit performing a heating treatment on the wafer W after exposure processing and so on are assigned, for example, to ten tiers in the vertical direction as shown in FIG. 3. Here, the delivery stages TRS5 and TRS6 are used for delivering the wafer W between the inspection block 40 and the treatment block S1, and the delivery stages TRS 7 and TRS8 are used for delivering the wafer W between the two main arms 26A and 26B. In this example, the heating module LHP, the heating module PAB, the heating module PEB, and the cooling modules CPL1, CPL2, and CPL3 correspond to the treatment modules.

As shown in FIG. 1, the first interface block S2 includes: a delivery arm 31 which is configured to freely lift up and down and rotate around the vertical axis and delivers the wafer W to/from the cooling module CPL2 and the heating module PEB in the shelf module 25C of the treatment block S1 as described later; a shelf module 32A in which an in-buffer cassette for temporarily housing the wafer W to be transferred into an edge exposure unit and the aligner S4 and an out-buffer cassette for temporarily housing the wafer W transferred out of the aligner S4 are multi-tiered; and a shelf module 32B in which a delivery stage for the wafer W and a high-precision temperature regulating module are multi-tiered.

The second interface block S3 includes a delivery arm 33. The delivery arm 33 delivers the wafer W to/from the delivery stage and the high-precision temperature regulating module in the first interface block S2, and an in-stage 34 and an out-stage 35 in the aligner S4.

Next, the flow of a wafer when coating and developing treatments are performed on the wafer in the treatment block S1 will be described.

When the carrier CR1 housing wafers W which will be subjected to coating and developing treatments is transferred into the carrier block 21 from the outside, the opening/closing unit 23 is opened and a lid body of the carrier CR1 is removed, and the wafer W is taken out by the delivery arm 24. The wafer W is delivered from the delivery arm 24 to the delivery stage TRS1 and transferred by the transfer arm 4 in the inspection module 40 to the delivery arm TRS5. Subsequently, the main arm 26A receives the wafer W from the delivery stage TRS5. Thereafter, the wafer W is transferred by the main arms 26A and 26B through the route of the delivery stage TRS5, the cooling module CPL1, the coating module COT, the delivery state TRS7, the heating module PAB, and the cooling module CPL2. The wafer W on which the resist solution has been applied in this manner is transferred to the first interface block S2 via the cooling module CPL2.

In the first interface block S2, the wafer W is transferred by the delivery arm 31 in the order of the in-buffer cassette, the edge exposure unit, and the high-precision temperature regulating module, and transferred via the delivery stage in the shelf module 32B to the second interface block S3. Thereafter, the wafer W is transferred by the delivery arm 33 via the in-stage 34 in the aligner S4 to the aligner S4, where the wafer W is subjected to exposure.

After the exposure, the wafer W is transferred in the order of the out-stage 35, the second interface block S3, and the out-buffer cassette in the first interface block S2, and then transferred via the delivery arm 31 to the heating module PEB in the treatment block S1. Thereafter, the wafer W is transferred through the route of the cooling module CPL3, the developing unit DEV, the heating module LHP, the delivery state TRS8, and the delivery stage TRS6. In this manner, a predetermined resist pattern is formed on the wafer W on which a predetermined developing treatment has been performed in the developing unit DEV.

The coating and developing apparatus 2 is provided with the control unit 50 including, for example a computer, and its configuration is shown in FIG. 4. In FIG. 4, numeral 51 denotes a bus, and a CPU 52 and a work memory 53 for performing various kinds of calculation are connected to the bus 51. A program storage unit 54 in which various kinds of programs are stored is also connected to the bus 51. The programs are stored in the program storage unit 54 while being stored in a storage medium such as a hard disk, a compact disk, a magneto-optical disk, or a memory card.

To the control unit 50, a host computer 55 is connected. The host computer 55 identifies, for each carrier transferred to the coating and developing apparatus 2, the lot of wafers housed in the carrier for which what kind of treatment will be performed, for example, by an identification code. The host computer 55 transmits a signal corresponding to the identification code to the control unit 50 by the time when the carrier CR1, CR2 is transferred to the coating and developing apparatus 2. The control unit 50 reads various kinds of programs based on the signal, and a series of treatment processes including the transfer operation of the delivery arm 24 and the transfer arm 4 are controlled by the read programs.

Further, the control unit 50 is configured to assign wafer numbers to 25 wafers W housed in each of the carriers CR1 and CR2 in the order of the wafers W transferred into the carrier block 21. An operator can set whether to perform inspection in one or more of the inspection modules IM1 to IM3 or not at all, for the first wafer "1" to the last wafer "25" in each lot, from an input screen before the carrier CR1, CR2 is transferred into the coating and developing apparatus 2.

For the lot for which a normal slimming treatment is performed, the control unit 50 further obtains, holds, and manages data obtained by performing line width measurement of a resist pattern formed by performing coating and developing treatments, for each carrier transferred to the coating and developing apparatus 2. Further, prior to performance of treatment on the lot for which the normal slimming treatment will be performed, for example, the slimming treatment process is performed on a plurality of wafers with a treatment condition such as the kind of resist material, the concentration of acid in a solution containing an acid, or the like changed, and the control unit 50 obtains data of the slim amount that is the difference between line widths before and after performance of the slimming treatment process for each of the wafers and prepares a database storing data of the correlation between the treatment condition of the slimming treatment and the slim amount.

Next, the slimming treatment method and a resist pattern forming method according to this embodiment will be described with reference to FIG. 5 to FIG. 6G.

Figure 5:
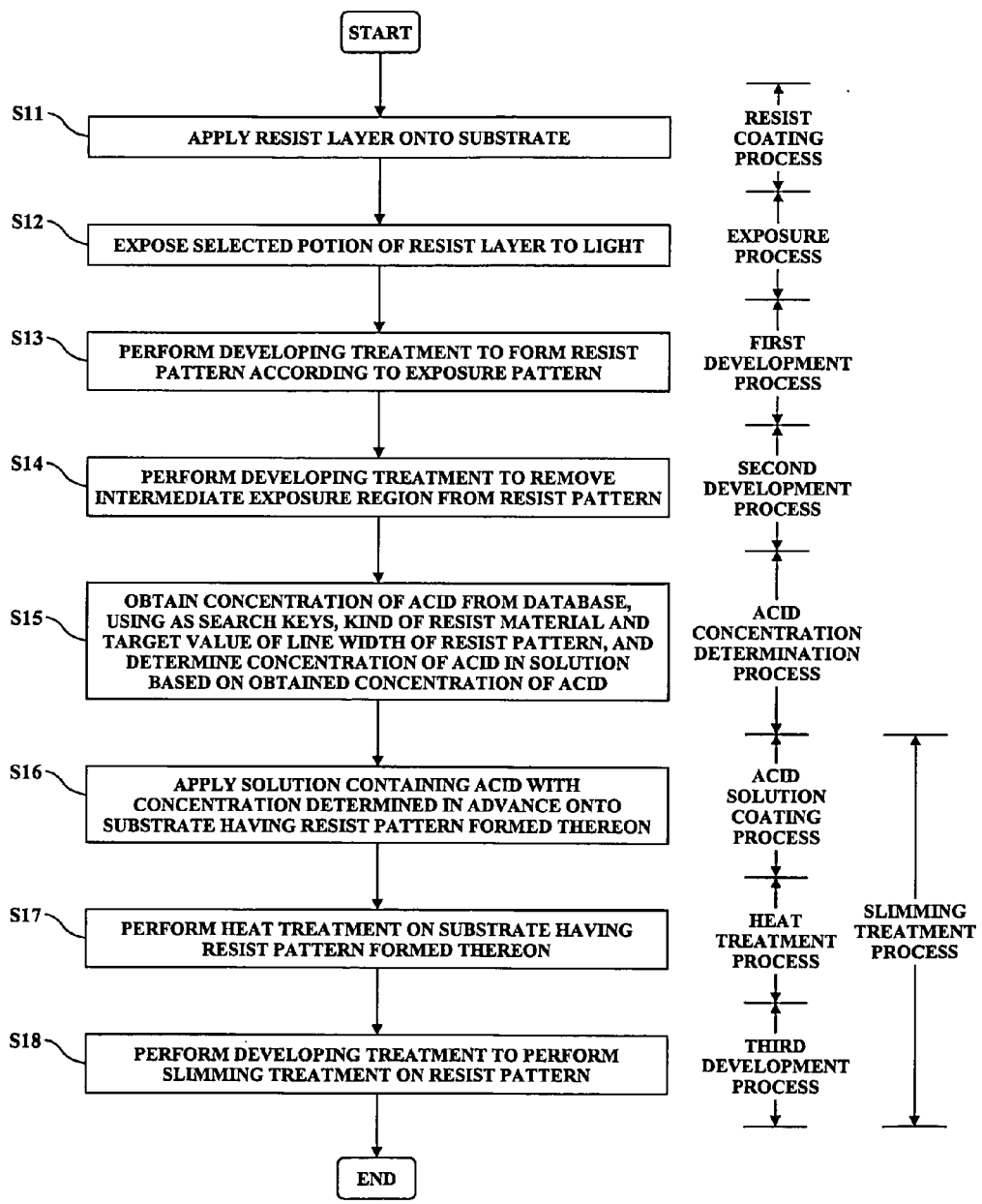
FIG. 5 is a flowchart for explaining a procedure of processes of a resist pattern slimming treatment method and a resist pattern forming method according to the first embodiment of the present invention.

FIG. 5 is a flowchart for explaining a procedure of processes of the resist pattern slimming treatment method and the resist pattern forming method according to this embodiment. FIG. 6A to FIG. 6G are sectional views each schematically showing the structure on the front surface of the substrate at each of the steps in the resist pattern slimming treatment method according to this embodiment.

Note that FIG. 6A to FIG. 6G show the structures on the front surface of the substrate after Step S11 to Step S14 and Step S16 to Step S18 are performed respectively.

The resist pattern forming method including the resist pattern slimming treatment method according to this embodiment includes, as shown in FIG. 5, a resist coating process (Step S11), an exposure process (Step S12), a first development process (Step S13), a second development process (Step S14), an acid concentration determination process (Step S15), and a slimming treatment process (Step S16 to Step S18). Further, the slimming treatment process includes an acid solution coating process (Step S16), a heat treatment process (Step S17), and a third development process (Step S18). Further, the resist pattern slimming treatment method according to this embodiment includes the acid concentration determination process at Step S15 to the third development process at Step S18.

More specifically, the resist pattern slimming treatment method according to this embodiment includes a slimming treatment process of performing a slimming treatment on the resist pattern by applying a solution containing an acid onto a substrate having a resist pattern formed thereon (Step S16), then performing a heat treatment (Step S17), and then performing a developing treatment (Step S18). Before the slimming treatment process is performed, a database storing kinds of resist material for the resist pattern, concentrations of acid contained in a solution to be applied onto the substrate having the resist pattern formed thereon, and line widths (or slim amounts) of the resist pattern corresponding to the kinds of resist material and the concentrations of acid is prepared in advance. The concentration of the acid contained in the solution used in the slimming treatment process is determined based on a concentration of the acid obtained from the database, using, as search keys, the kind of resist material and the target value of the line width (or the slim amount) of a portion of the resist pattern lower than a predetermined height from the front surface of the substrate (Step S15).

Figure 6A:
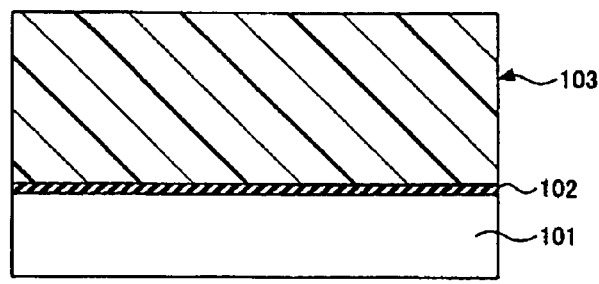
FIG. 6A is a sectional view schematically showing the structure on a front surface of a substrate at one step of the resist pattern slimming treatment method according to the first embodiment of the present invention.

First of all, the resist coating process at Step S11 is performed. The resist coating process is a process of applying a bottom anti-reflection coating (BARC) 102 and a resist layer 103 onto a base layer 101. FIG. 6A shows the structure of a resist pattern after the process at Step S11 is performed.

At Step S11, the bottom anti-reflection coating 102 is first formed on the base layer 101. An example of the base layer 101 is a semiconductor wafer itself, or a semiconductor device internal structure such as an inter-layer insulating film formed on the semiconductor wafer. The bottom anti-reflection coating 102 is formed, for example, by applying a resist to which an anti-reflection agent is added or depositing a bottom anti-reflection coating. Note that the bottom anti-reflection coating 102 may be formed when necessary.

Subsequently, at Step S11, the coating module COT in the coating and developing apparatus 2 is used to apply a resist onto the bottom anti-reflection coating 102, and pre-baking is performed on the applied resist to evaporate a solvent therein and harden the resist, thereby forming the resist layer 103 as shown in FIG. 6A. An example of the resist is a chemically amplified resist. An example of the chemically amplified resist is a resist which generates solubilized substance soluble in a solvent, for example, by being irradiated with light. As a concrete example, a chemically amplified resist that contains photoacid generator (PAG) and deals with exposure using an ArF excimer laser (having a wavelength of 193 nm) as a light source is used in this example. PAG generates acid when irradiated with light. Acid reacts with an alkali-insoluble protecting group contained in the resist and changes the alkali-insoluble protecting group into an alkali-soluble group (solubilized substance). An example of the above-described reaction is acid-catalyzed reaction.

Figure 6B:
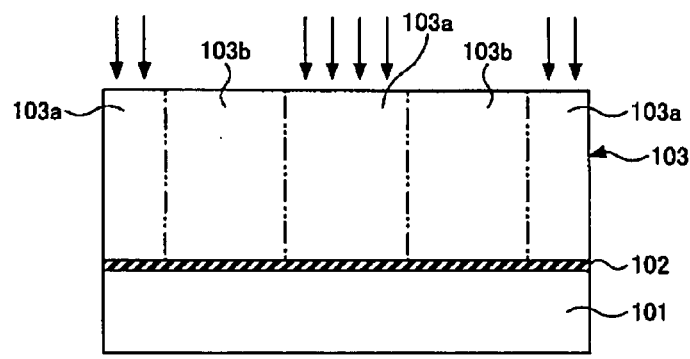
FIG. 6B is a sectional view schematically showing the structure on the front surface of the substrate at one step of the resist pattern slimming treatment method according to the first embodiment of the present invention.

Subsequently, the exposure process at Step S12 is performed. The exposure process is a process of exposing a selected portion of the resist layer 103 to light. FIG. 6B shows the structure of the resist pattern after the process at Step S12 is performed.

At Step S12, as shown in FIG. 6B, the selected portion of the resist layer 103 is exposed to light, whereby a solubilized substance which is soluble in an alkaline solvent (developing solution) is selectively generated. The resist in this example is the chemically amplified resist containing PAG. In this embodiment, to activate the acid generated in the resist layer 103 and promote the change of the alkali-insoluble protecting group into the alkali-soluble group (solubilized substance), post-exposure bake (PEB) is performed. By selectively generating the solubilized substance as described above, an exposure pattern composed of, for example, a soluble layer 103a soluble in an alkaline solvent (developing solution) and an insoluble layer 103b insoluble in the alkaline solvent is obtained in the resist layer 103.

Figure 6C:
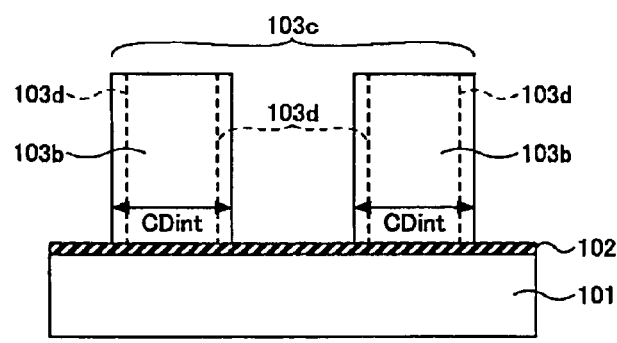
FIG. 6C is a sectional view schematically showing the structure on the front surface of the substrate at one step of the resist pattern slimming treatment method according to the first embodiment of the present invention.

Subsequently, the first development process at Step S13 is performed. The first development process is a process of performing a developing treatment to form a resist pattern 103c according to the exposure pattern. FIG. 6C shows the structure of the resist pattern after the process at Step S13 is performed.

At Step S13, as shown in FIG. 6C, the developing unit DEV in the coating and developing apparatus 2 is used, for example, to remove the soluble layer 103a from the resist layer 103 in which the exposure pattern has been formed, to form a resist pattern 103c according to the exposure pattern. In this example, the soluble layer 103a is removed by spraying the alkaline solvent (developing solution) onto the resist layer 103 in which the exposure pattern has been formed. Thereby, the resist pattern 103c composed of the insoluble layer 103b is formed. Subsequently, post-bake is performed, when necessary, in order to harden the resist pattern 103c. Thus, the first development process ends. The line width of the resist pattern 103c after the first development process is performed is CDint.

Figure 6D:
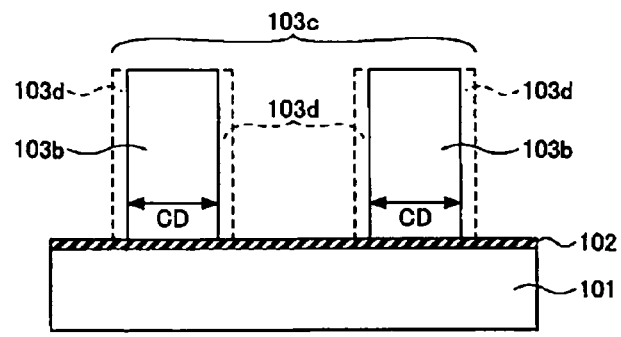
FIG. 6D is a sectional view schematically showing the structure on the front surface of the substrate at one step of the resist pattern slimming treatment method according to the first embodiment of the present invention.

Subsequently, the second development process at Step S14 is performed. The second development process is a process of removing an intermediate exposure region from the resist pattern 103c. FIG. 6D shows the structure of the resist pattern after the process at Step S14 is performed.

On a side surface of the resist layer 103 after the first development process is performed, there arises a region having an intermediate property between the soluble layer 103a and the insoluble layer 103b, namely, a region which is originally a soluble region but not completely solubilized or which is originally an insoluble region but has a small number of soluble groups generated therein. Such a region is called an intermediate exposure region 103d hereinafter. The reason why the intermediate exposure region 103d arises is, for example, that it is increasingly difficult, with increased miniaturization of the semiconductor device, to secure a sufficient contrast in exposure amount at the boundary between the exposed region and the not-exposed region.

At step S14, as shown in FIG. 6D, the intermediate exposure region 103d is removed by performing a developing treatment, for example, with the temperature of the developing solution set at not lower than 23° C. nor higher than 50° C., the concentration of the developing solution set at not lower than 2.38% nor higher than 15%, and the developing time set at not shorter than 20 sec nor longer than 300 sec. By removing the intermediate exposure region 103d, the resist pattern 103c having a line width CD smaller than the line width CDint of the resist pattern 103c after the first development process is performed can be formed.

Note that the second development process at Step S14 can be omitted. In other words, after the first development process at Step S13 is performed, the acid concentration determination process at Step S15 may be performed with the second development process at Step S14 omitted.

Subsequently, the acid concentration determination process being Step S15 is performed. The acid concentration determination process is a process of determining the concentration of the acid contained in the solution to be applied onto the substrate in the subsequent acid solution coating process.

At Step S15, a concentration of the acid is obtained from the database, using, as search keys, the kind of resist material and the target value of the line width (or the slim amount) of the resist pattern, and the concentration of the acid contained in the solution to be applied onto the substrate in the subsequent acid solution coating process is determined based on the obtained concentration of the acid.

A method of preparing the database in advance and a method of determining the concentration of the acid at Step S15 will be described later.

Figure 6E:
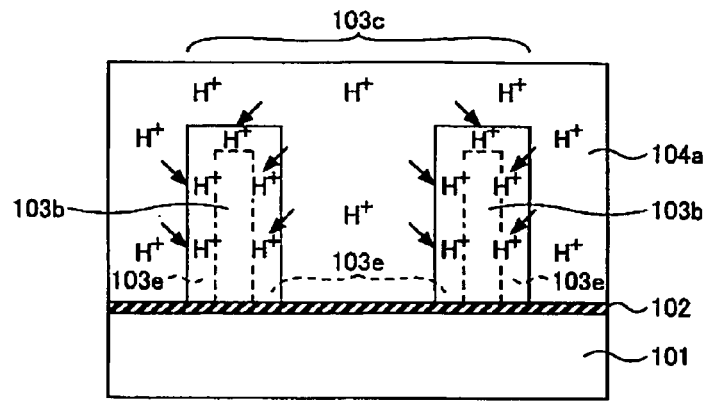
FIG. 6E is a sectional view schematically showing the structure on the front surface of the substrate at one step of the resist pattern slimming treatment method according to the first embodiment of the present invention.

Then, the acid solution coating process at Step S16 is performed. The acid solution coating process is a process of applying the solution containing the acid with the concentration determined in advance onto the substrate having the resist pattern 103c formed thereon. FIG. 6E shows the structure of the resist pattern after the process at Step S16 is performed.

At Step S16, the coating module COT in the coating and developing apparatus 2 is used, for example, to apply the solution containing acid solubilizing the resist pattern 103c with the concentration determined in advance onto the resist pattern 103c as shown in FIG. 6E. An example of the reactant is acid. As an example of an acid solution containing acid, for example, a top anti-reflection coating (TARC) can be used. Specifically, a solution 104a containing the reactant, for example, acid ($H^+$) is applied onto the resist pattern 103c.

Figure 6F:
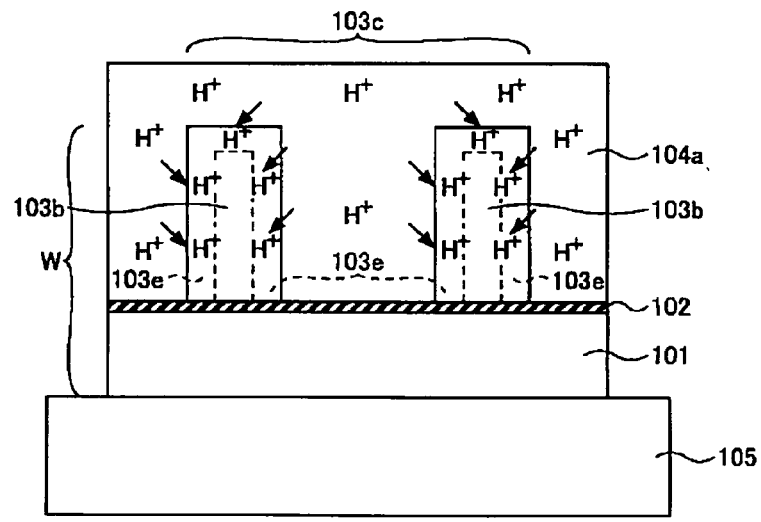
FIG. 6F is a sectional view schematically showing the structure on the front surface of the substrate at one step of the resist pattern slimming treatment method according to the first embodiment of the present invention.

Subsequently, the heat treatment process at Step S17 is performed. The heat treatment process is a process of performing a heat treatment under a predetermined heat treatment condition to diffuse the reactant into the resist pattern 103c. FIG. 6F shows the structure of the resist pattern after Step S17 is performed.

At Step S17, the heat treatment is performed at the heat treatment temperature determined in advance to diffuse the reactant into the resist pattern 103c as shown in FIG. 6F, thereby forming a new soluble layer 103e on the front surface of the resist pattern 103c. As shown in FIG. 6F, the substrate on which the resist pattern 103c is formed, for example, the semiconductor wafer W is baked using a baker 105, whereby the diffusion amount of the reactant, for example, acid (In can be increased. Alternatively, for example, the heating module PEB or the like in the coating and developing apparatus 2 may be used. Further, the bake can activate the acid ($H^+$) diffused in the resist pattern 103c and promote change of the insoluble layer 103b to the new soluble layer 103e. An example of the change of the insoluble layer 103b to the new soluble layer 103e is, for example, change from an alkali-insoluble protecting group to an alkali-soluble group (solubilized substance) using acid ($H^+$) as a catalyst.

Note that a too high bake temperature causes pattern collapse or pattern fall, and therefore it is preferable to set the upper limit for the bake temperature. The upper limit of the bake temperature differs depending on the kind of the resist constituting the resist pattern 103c, but can be 110° C. in an example shown in this embodiment. Further, the preferable bake temperature ranges from 50° C. to 180° C.

After Step S16 and Step S17 are performed to form the new soluble layer 103e by liquid-phase diffusion as described above, the third development process at Step S18 is performed. Step S18 is a process of removing the new soluble layer 103e from the resist pattern 103c having the new soluble layer 103e formed therein. An example of removal, a developing treatment can be performed. Here, an example in which the third development process is performed as Step S18 will be described. FIG. 6G shows the structure of the resist pattern after the process at Step S18 is performed.

Figure 6G:
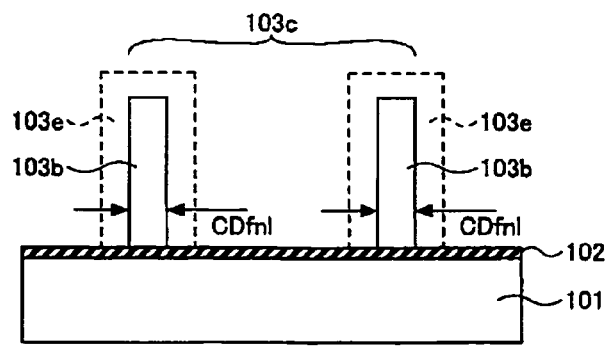
FIG. 6G is a sectional view schematically showing the structure on the front surface of the substrate at one step of the resist pattern slimming treatment method according to the first embodiment of the present invention.

At Step S18, the developing unit DEV in the coating and developing apparatus 2 is used, for example, to spray the alkaline solvent (developing solution) onto the resist pattern 103c in which the new soluble layer 103e has been formed, thereby removing the new soluble layer 103e as shown in FIG. 6G. After Step S18 is performed, post-bake is performed, when necessary, in order to harden the resist pattern 103c.

According to this embodiment, after the first development process shown in FIG. 6C, the removal process (the second development process) for the intermediate exposure region 103d shown in FIG. 6D and the removal process (the third development process) for the new soluble layer 103e shown in FIG. 6G are performed. By removing the intermediate exposure region 103d and the new soluble layer 103e, the resist pattern 103c can be formed which has a line width CDfnl smaller than the line width CDint of the resist pattern 103c after the first development process is performed.

Next, the method of preparing the database in advance will be described with reference to FIG. 7.

Figure 7:
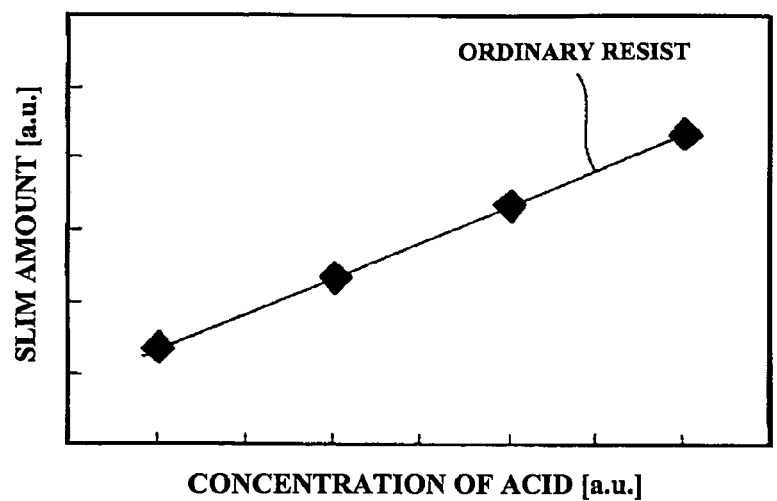
FIG. 7 is a graph indicating the relation between the concentration of the acid contained in a solution to be applied in an acid solution coating process and the slim amount which is prepared in advance before the resist pattern slimming treatment method according to first embodiment of the present invention is started.

FIG. 7 is a graph indicating the relation between the concentration of the acid contained in the solution to be applied in the acid solution coating process and the slim amount which is prepared in advance before the resist pattern slimming treatment method according to this embodiment is started.

The resist pattern forming method including the resist pattern slimming treatment method according to this embodiment is performed as described below to prepare a database storing data of kinds of resist material for the resist pattern, concentrations of acid contained in a solution to be applied onto the substrate having the resist pattern formed thereon, and slim amounts of the resist pattern.

As described above, the slim amount of the resist pattern is the amount of change in line width of the resist pattern between before and after the slimming treatment process. Accordingly, when the line widths of resist patterns before the slimming treatment process are nearly equal, the data of the line widths of the resist pattern after the slimming treatment may be stored in the database in place of the data of the slim amounts, and the line width after the slimming treatment may be used as a search key in place of the target value of the slim amount. In this case, a database storing data of kinds of resist material for the resist pattern, concentrations of acid contained in a solution to be applied onto the substrate having the resist pattern formed thereon, and line widths of the resist pattern after the slimming treatment, is prepared in advance.

Specifically, with the material for the resist pattern and the concentration of the acid contained in the solution to be applied onto the substrate changed, the pattern forming method composed of processes at Step S11 to Step S14 and Step S16 to Step S18 is performed. Then, the line widths of the resist pattern before and after the slimming treatment process are measured, and the slim amount is calculated from the amount of change in line width between before and after the slimming treatment process.

Besides, the measurement of the line widths of the resist pattern before and after the slimming treatment process is performed by transferring the wafer, for example, to the inspection module IM1 being the film thickness and line width inspection module using the ODP including scatterometry, and measuring the line width.

In the ODP, as in spectroscopic ellipsometry or the like, polarized light is made incident on an object to be measured, and an amplitude ratio spectrum and a phase difference spectrum of reflection light being reflected incident light are measured, whereby the reflectance is measured. When the incident light composed of normal white light that is not polarized light passes through a polarizer, the incident light becomes a linearly polarized light having an electric field vector parallel to one axis of the polarizer. The linearly polarized light is composed of a p-polarized light having a vector component parallel to the incident plane that is a plane including the incident light and the reflection light, and an s-polarized light having a vector component perpendicular to the incident plane. The ellipsometry is a measurement method of measuring a change in polarized light generated when each of the p-polarized light and the s-polarized light of the incident light is reflected from a medium. The change in polarized light is composed of two components such as the change in amplitude (intensity) and the change in phase.

On the other hand, in the ODP, the reflectance when a cyclic pattern is formed on the substrate being an object to be measured is calculated. When the object to be measured is a cyclic pattern, the object to be measured can be regarded as a diffraction grating. The reflection light becomes a diffracted reflection light which is diffracted by the diffraction grating. As the calculation of the reflectance when the diffracted reflection light is reflected, for example, rigorous coupled wave analysis (hereinafter referred to as RCWA) can be used which is described in U.S. Pat. No. 5,835,225 or U.S. Pat. No. 5,739,909. On assumption that the material constant such as a dielectric constant and the like, the sectional shape of the diffraction grating is modeled by a method of approximating it as an aggregate of rectangular elements or the like, and the diffraction reflectance of the modeled sectional shape is calculated. The calculated value of the diffraction reflectance calculated as described above and the measurement value of the diffraction reflectance are compared and analyzed, whereby the sectional shape can be calculated. As a result, the line width of the resist pattern 103c can be measured.

The relation between the concentration of acid and the slim amount obtained as described above for the resist pattern composed of an ordinary resist material is shown in FIG. 7. As shown in FIG. 7, the concentration of acid and the slim amount have a substantially linear relation for concentrations of the acid within a certain range. Such a relation between the concentration of acid and the slim amount is obtained, and a database storing concentrations of acid and slim amounts of the resist pattern corresponding to the kinds of resist material and the concentrations of acid is prepared in advance. When the concentration of acid and the slim amount have a substantially linear relation, it is possible to determine the concentration of acid corresponding to the target value of the slim amount Note that the line width may be used in place of the slim amount as described above.

Next, the fact that the slim amount differs depending on the kind of resist material, and a conventional method of obtaining the concentration of the acid contained in the solution will be described with reference to FIG. 8A to FIG. 8C and FIG. 9.

Figure 8A:
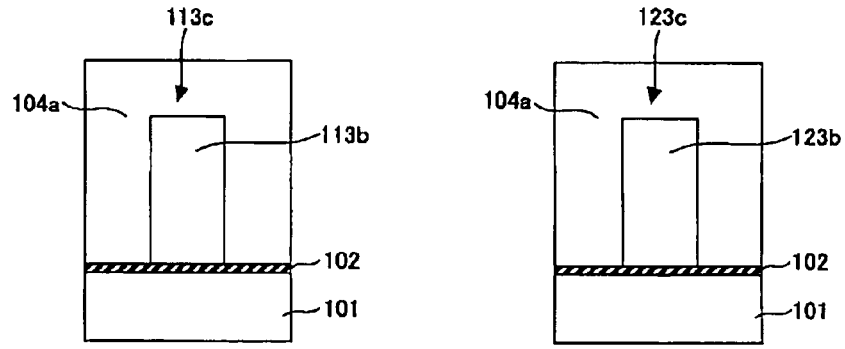
FIG. 8A is a view for explaining that the slim amount differs depending on the kind of resist.
Figure 8B:
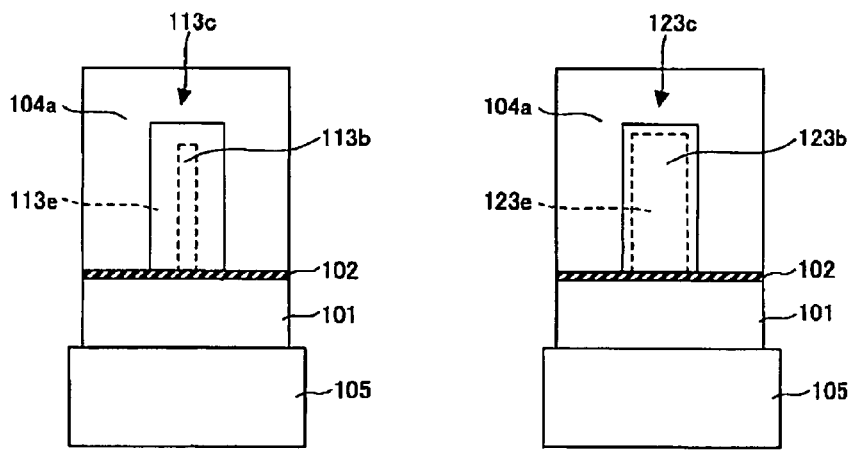
FIG. 8B is a view for explaining that the slim amount differs depending on the kind of resist.
Figure 8C:
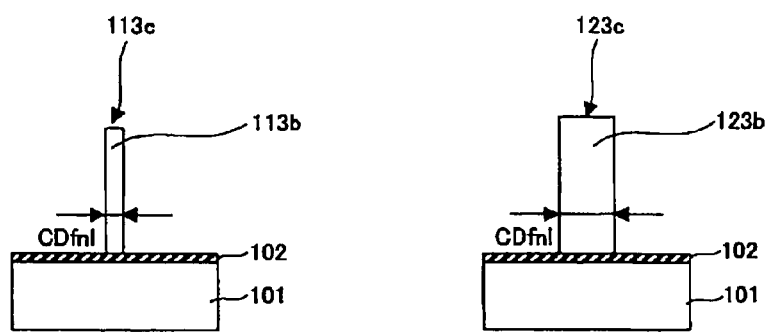
FIG. 8C is a view for explaining that the slim amount differs depending on the kind of resist.
Figure 9:
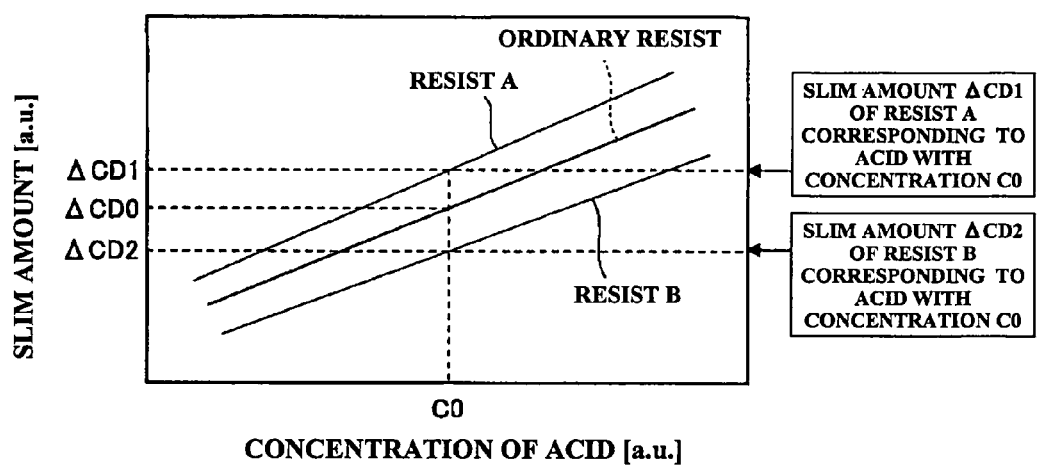
FIG. 9 is a graph for explaining a method of obtaining the concentration of the acid contained in the solution in a conventional resist pattern slimming treatment method.

FIG. 8A to FIG. 8C are views for explaining the fact that the slim amount differs depending on the kind of resist. FIG. 8A to FIG. 8C are views respectively showing the structures on the front surface of the substrate after the respective processes at Step S16 to Step S18 described above are performed, and correspond to FIG. 6E to FIG. 6G, respectively. In each of FIG. 8A to FIG. 8C, the case where a resist A that easily reacts with a solution containing an acid is applied is shown on the left side, and the case where a resist B that hardly reacts with a solution containing an acid is applied is shown on the right side. FIG. 9 is a graph for explaining a method of obtaining the concentration of the acid contained in the solution in the conventional resist pattern slimming treatment method.

As shown in FIG. 8A, when the acid solution coating process at Step S16 is performed, there is little or no difference between the case where the solution 104a containing an acid is applied to a resist pattern 113c made of the resist A and the case where the solution 104a containing an acid is applied to a resist pattern 123c made of the resist B. Further, most of the resist patterns 113c and 123c are composed of insoluble layers 113b and 123b, respectively.

However, as shown in FIG. 8B, when the heat treatment process at Step S17 is performed, the widths of regions of new soluble layers 113e and 123e formed on front surfaces of the resist patterns 113c and 123c are different from each other because the speeds of the reactant diffusing into the resist patterns 113c and 123c are different between the resist A and the resist B. Further, accompanying with that, the widths of the regions of the insoluble layers 113b and 123b are different from each other.

As a result, when the third development process at Step S18 is performed, the line widths CDfnl of the resist patterns 113c and 123c after the new soluble layers 113e and 123e are removed are different from each other as shown in FIG. 8C.

Using the relation between the concentration of acid and the slim amount shown in FIG. 9, the above described fact will be explained as follows. It is assumed that the concentration of the acid contained in the solution is C0, the differences between the line widths CDfnl and the line widths CDint in the resist patterns 113c made of the resist A and the resist pattern 123c made of the resist B are $\Delta CD1$ and $\Delta CD2$, respectively. Further, it is assumed that the difference between the line width CDfnl and the line width CDint in the resist pattern 103c made of an ordinary resist is the slim amount $\Delta CD0$. Then, the relation $\Delta CD1 > \Delta CD0 > \Delta CD2$ is established.

Next, the method of obtaining the concentration of the acid in the acid concentration determination process at Step S15 will be described using FIG. 10.

Figure 10:
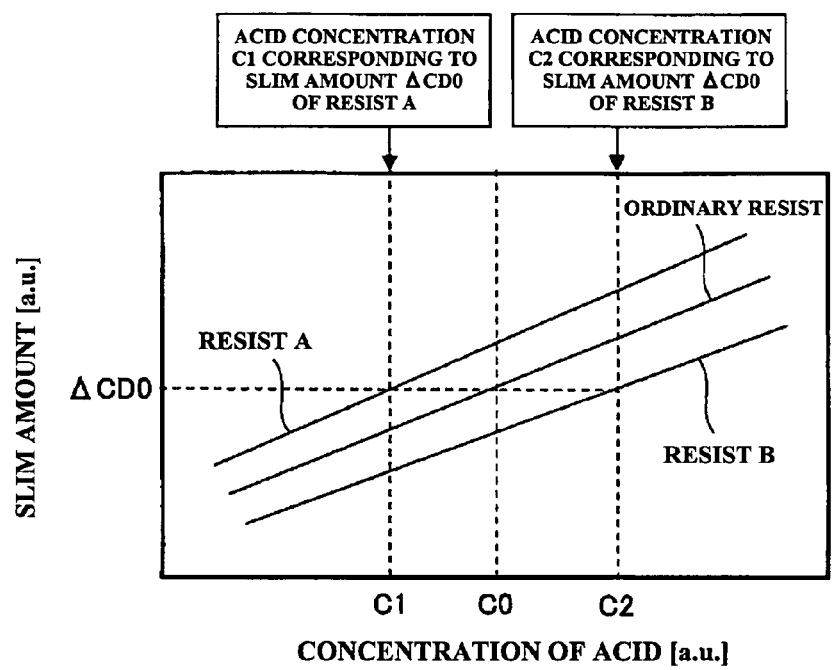
FIG. 10 is a graph for explaining a method of obtaining the concentration of the acid contained in the solution in the resist pattern slimming treatment method according to first embodiment of the present invention.

FIG. 10 is a graph for explaining the method of obtaining the concentration of the acid contained in the solution in the resist pattern slimming treatment method according to this embodiment.

The acid concentration determination process being Step S15 is performed with the above-described database prepared in advance. The acid concentration determination process is a process of obtaining a concentration of the acid from the database, using, as search keys, the kind of resist material and the target value of the line width (or the slim amount) of the resist pattern, and determining the concentration of the acid contained in the solution based on the obtained concentration of the acid.

In the resist pattern slimming treatment method according to this embodiment, when there are variations in slim amount depending on the kind of resist material, the concentration of the acid contained in the solution can be changed to correct the variations. For example, when it is intended to bring the slim amount to $\Delta$CD0 irrespective of the kind of resist material, the concentration of the acid contained in the solution for the resist A is set to C1 that corresponds to the slim amount CD0 of the resist A and the concentration of the acid contained in the solution for the resist B is set to C2 that corresponds to the slim amount $\Delta$CD0 of the resist B.

As the method of changing the concentration of the acid contained in the solution from C0 to C1 or C2, the solution to be used in the slimming treatment process can be selected from among a plurality of kinds of solutions containing acids with different concentrations. By preparing the plurality of kinds of solutions containing acids with different concentrations from each other in advance, the concentration of the acid can be easily changed without performing a process of adjusting the concentration of the acid.

Next, the fact that a fixed slim amount can be obtained irrespective of the kind of resist material will be described using FIG. 11A to FIG. 11C.

Figure 11A:
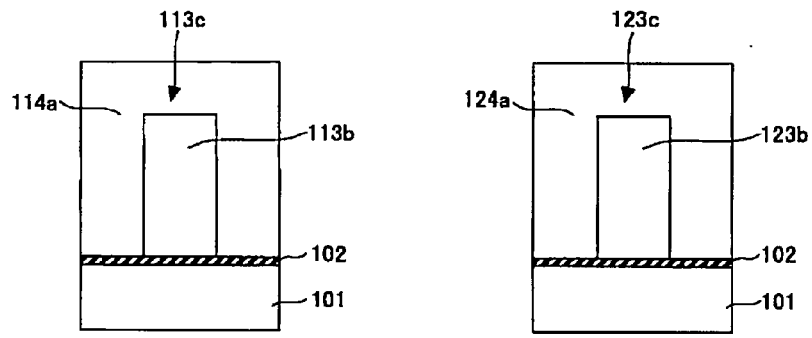
FIG. 11A is a view for explaining that a fixed slim amount is obtained irrespective of the kind of resist material in the resist pattern slimming treatment method according to the first embodiment of the present invention.
Figure 11B:
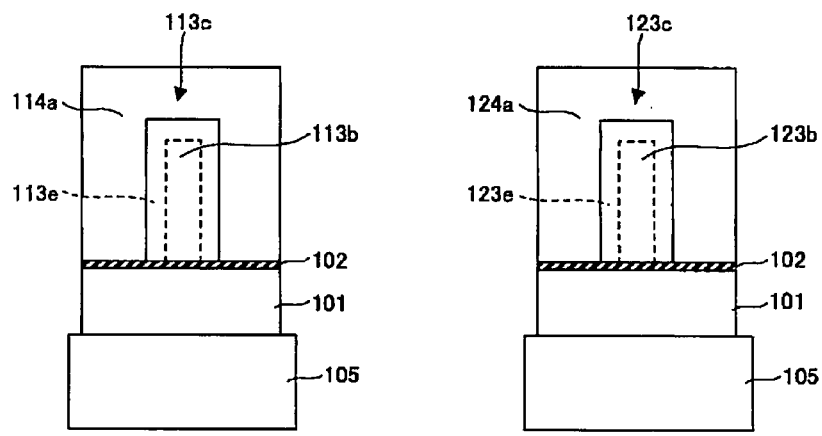
FIG. 11B is a view for explaining that the fixed slim amount is obtained irrespective of the kind of resist material in the resist pattern slimming treatment method according to the first embodiment of the present invention.
Figure 11C:
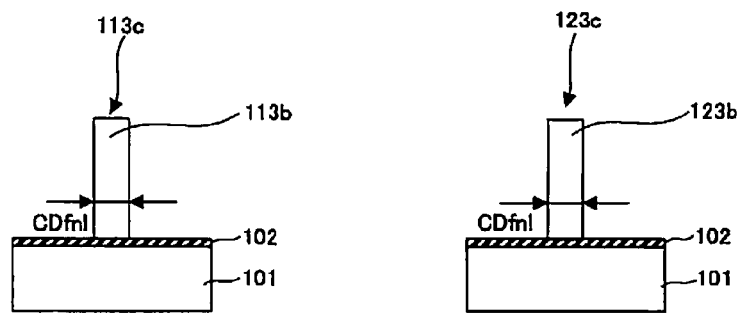
FIG. 11C is a view for explaining that the fixed slim amount is obtained irrespective of the kind of resist material in the resist pattern slimming treatment method according to the first embodiment of the present invention.

FIG. 11A to FIG. 11C are views for explaining the fact that a fixed slim amount can be obtained irrespective of the kind of resist material in the resist pattern slimming treatment process according to this embodiment. FIG. 11A to FIG. 11C are views respectively showing the structures on the front surface of the substrate after the respective processes at Step S16 to Step S18 are performed, and correspond to FIG. 6E to FIG. 6G, respectively. In each of FIG. 11A to FIG. 11C, the case where the resist A is applied is shown on the left side, and the case where the resist B is applied is shown on the right side.

As shown in FIG. 11A, when the acid solution coating process at Step S16 is performed, a solution 114a containing the acid with the concentration C1 lower than the normal concentration C0 is applied to the resist pattern 113c made of the resist A and a solution 124a containing the acid with the concentration C2 higher than the normal concentration C0 is applied to the resist pattern 123C. Because the concentration of the acid contained in the solution is different between the resist A and the resist B, the speeds of the reactant diffusing into the resist patterns 113c and 123c are nearly equal between the resist A and the resist B as shown in FIG. 11B when the heat treatment process at Step S17 is performed. Further, the widths of regions of the new soluble layers 113e and 123e formed on front surfaces of the resist patterns 113c and 123c are nearly equal. Furthermore, the widths of regions of the insoluble layers 113b and 123b are also nearly equal. As a result, the line widths CDfnl of the resist patterns 113c and 123c after the new soluble layers 113e and 123e are removed are nearly equal as shown in FIG. 11C when the third development process at Step S18 is performed.

As described above, in this embodiment, the relation between the concentration of acid and the slim amount is obtained for each kind of resist material, and a database storing kinds of resist material, concentrations of acid, and slim amounts (or line widths) of the resist pattern corresponding to the kinds of resist material and the concentrations of acid is prepared in advance. When the concentration of acid and the slim amount (or the line width) have a substantially linear relation for each kind of resist material, the concentration of acid corresponding to the target value of the slim amount (or the line width) can be determined. As a result, the line widths of the resist patterns after the slimming treatment process can be made nearly equal irrespective of the kind of resist material.

Note that in the slimming treatment method according to this embodiment, the method of selecting the solution to be used in the slimming treatment process from among a plurality of kinds of solutions containing acids with concentrations different from each other is used as the method of changing the concentration of the acid contained in the solution. As the method of changing the concentration of the acid contained in the solution, however, a solvent may be mixed into the solution containing the acid with a high concentration to adjust the concentration of the acid. It is only necessary to adjust the mixture ratio of mixing the solvent, and therefore it is unnecessary to prepare in advance the plurality of kinds of solutions containing acids with different concentrations.

Second Embodiment

Next, a resist pattern slimming treatment method and a resist pattern forming method according to a second embodiment of the present invention will be described with reference to FIG. 12 to FIG. 14.

First, processes of the resist pattern slimming treatment method according to this embodiment will be described with reference to FIG. 12.

FIG. 12 is a flowchart for explaining a procedure of processes of the resist pattern slimming treatment method and the resist pattern forming method according to this embodiment. Further, the parts which have been previously described are given the same numerals and description thereof will be omitted in some cases in the following sentences (this also applies to following modification examples).

The resist pattern slimming treatment method according to this embodiment is different from the slimming treatment method according to the first embodiment in that the acid solution coating process is composed of two acid solution coating processes of applying solutions containing acids with concentrations different from each other.

In the resist pattern slimming treatment method according to the first embodiment, the solution containing an acid with one kind of concentration predetermined in advance is applied. On the other hand, in the resist pattern slimming treatment method according to this embodiment, a first solution containing an acid with a concentration predetermined in advance is applied to an extent of a predetermined height from the front surface of the substrate, and then a second solution containing an acid with a concentration higher than the concentration of the acid contained in the first solution is applied.

More specifically, the resist pattern slimming treatment method according to this embodiment includes a slimming treatment process of performing a slimming treatment on the resist pattern by applying the first solution containing the acid to the substrate having a resist pattern formed thereon to the extent of the predetermined height from the front surface of the substrate, then applying the second solution containing the acid with the concentration higher than the concentration of the acid contained in the first solution to the substrate on which the first solution has been applied, then performing a heat treatment, and then performing a developing treatment. Before the slimming treatment process is performed, a database storing kinds of resist material for the resist pattern, concentrations of acid contained in a solution to be applied onto the substrate having the resist pattern formed thereon, and line widths (or slim amounts) of the resist pattern corresponding to the kinds of resist material and the concentrations of acid is prepared in advance. The concentration of the acid contained in the first solution used in the slimming treatment process is determined based on a concentration of the acid obtained from the database, using, as search keys, the kind of resist material and the target value of the line width (or the slim amount) of a portion of the resist pattern lower than the predetermined height from the front surface of the substrate. The concentration of the acid contained in the second solution used in the slimming treatment process is determined based on a concentration of the acid obtained from the database, using, as search keys, the kind of resist material and the target value of the line width (or the slim amount) of a portion of the resist pattern higher than the predetermined height from the front surface of the substrate. Further, the line width of the portion of the resist pattern higher than the predetermined height is smaller than the line width of the portion of the resist pattern lower than the predetermined height.

Note that a coating and developing apparatus performing the resist pattern slimming treatment method according to this embodiment is the same as the coating and developing apparatus according to the first embodiment described using FIG. 1 to FIG. 4, and therefore description thereof will be omitted here.

The resist pattern forming method including the resist pattern slimming treatment method according to this embodiment includes, as shown in FIG. 12, a resist coating process (Step S21), an exposure process (Step S22), a first development process (Step S23), a second development process (Step S24), an acid concentration determination process (Step S25), and a slimming treatment process (Step S26 to Step S29). Further, the slimming treatment process includes a first acid solution coating process (Step S26), a second acid solution coating process (Step S27), a heat treatment process (Step S28), and a third development process (Step S29).

The processes at Step S21 to Step S24 and Step S28 and Step S29 are the same as the processes at Step S11 to Step S14 and Step S17 and Step S18 shown in FIG. 5 in the first embodiment, respectively. On the other hand, the processes at Step S25 to Step S27 are different from those according to the first embodiment.

Next, the processes at Step S25 to Step S29 will be described with reference to FIG. 13A to FIG. 13D.

FIG. 13A to FIG. 13D are sectional views each schematically showing the structure on the front surface of the substrate at each of the steps of the resist pattern slimming treatment method according to this embodiment.

FIG. 13A to FIG. 13D show the structures on the front surface of the substrate after the processes at Step S26 to Step S29 are performed respectively.

In the acid concentration determination process at Step S25, which is different from the acid concentration determination process at Step S15 in the first embodiment, a concentration of the acid is obtained from the database prepared in advance, using, as search keys, the kind of resist material and the target value of the line width of the portion of the resist pattern lower than the predetermined height from the front surface of the substrate, and the concentration of the acid contained in the first solution to be applied onto the substrate in the first acid solution coating process (a first concentration) is determined based on the obtained concentration of the acid. Further, a concentration of the acid is obtained from the database prepared in advance, using, as search keys, the kind of resist material and the target value of the line width of the portion of the resist pattern higher than the predetermined height from the front surface of the substrate, and the concentration of the acid contained in the second solution to be applied onto the substrate in the second acid solution coating process (a second concentration) is determined based on the obtained concentration of the acid.

Figure 13A:
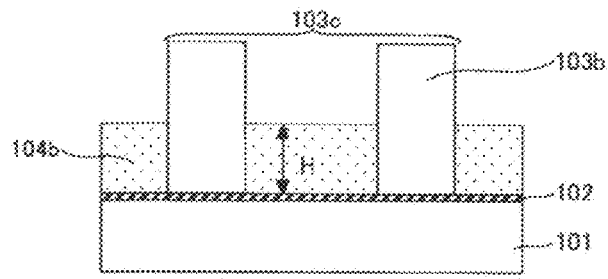
FIG. 13A is a sectional view schematically showing the structure on a front surface of a substrate at one step of the resist pattern slimming treatment method according to the second embodiment of the present invention.

The first acid solution coating process at Step S26 is a process of applying the first solution 104b containing the acid with the first concentration determined in advance onto the substrate having the resist pattern 103c formed thereon. FIG. 13A is a view showing the structure on the front surface of the substrate after the process at Step S26 is performed. The method of applying the solution can be performed similarly to Step S16 in the first embodiment. However, in the first acid solution coating process at Step S26, the thickness of application of the first solution 104b containing the acid with the first concentration is a predetermined height H from the front surface of the substrate as shown in FIG. 13A.

Figure 13B:
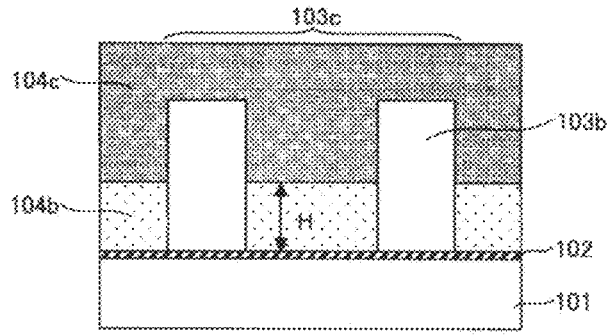
FIG. 13B is a sectional view schematically showing the structure on the front surface of the substrate at one step of the resist pattern slimming treatment method according to the second embodiment of the present invention.

The second acid solution coating process at Step S27 is a process of applying the second solution 104c containing the acid with the second concentration determined in advance onto the substrate on which the first solution 104b has been applied. FIG. 13B is a view showing the structure on the front surface of the substrate after the process at Step S27 is performed. The method of applying the solution can be performed similarly to Step S26 and Step S16. However, in the second acid solution coating process at Step S27, the first solution 104b has been already applied to the extent of the predetermined height H from the front surface of the substrate, and the second solution 104c is applied onto the first solution 104b as shown in FIG. 13B. In this embodiment, the concentration of the acid contained in the second solution 104c can be made higher than the concentration of the acid contained in the first solution 104b.

Figure 13C:
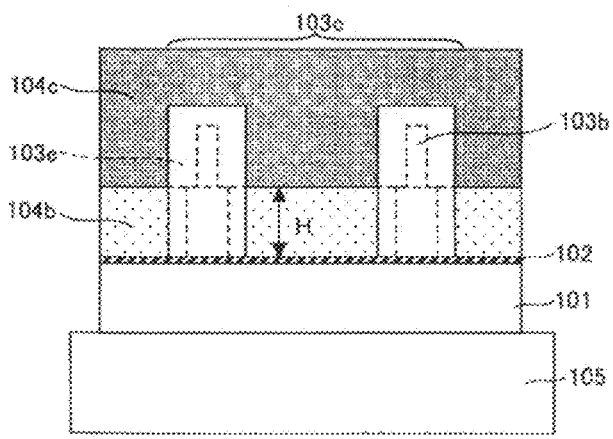
FIG. 13C is a sectional view schematically showing the structure on the front surface of the substrate at one step of the resist pattern slimming treatment method according to the second embodiment of the present invention.

The heat treatment process at Step S28 can be performed similarly to Step S17. FIG. 13C is a view showing the structure on the front surface of the substrate after the process at Step S28 is performed. However, the width of a region of the new soluble layer 103e formed on the surface of the resist pattern 103c is different between the portion of the resist pattern 103c lower than the predetermined height H from the front surface of the substrate and the portion of the resist pattern 103c higher than the predetermined height H from the front surface of the substrate because the concentration of the acid contained in the second solution 104c is higher than the concentration of the acid contained in the first solution 104b. As a result, the insoluble layer 103b of the resist pattern 103c has the width of the region of the portion higher than the predetermined height H which is smaller than the width of the region of the portion lower than the predetermined height H, and therefore has a protruding shape.

Figure 13D:
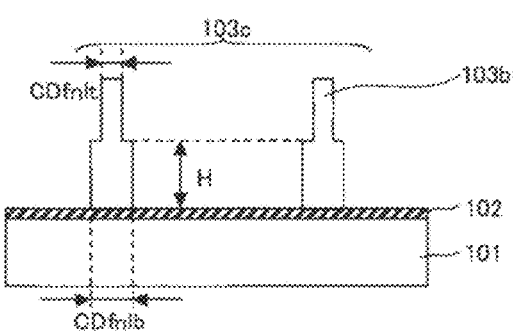
FIG. 13D is a sectional view schematically showing the structure on the front surface of the substrate at one step of the resist pattern slimming treatment method according to the second embodiment of the present invention.

The third development process at Step S29 can be performed similarly to Step S18. FIG. 13D is a view showing the structure on the front surface of the substrate after the process at Step S29 is performed. The resist pattern 103c after the process at Step S29 is performed has a protruding shape as shown in FIG. 13D in which the line width CDfnlt at the portion higher than the predetermined height H is smaller than the line width CDfnlb at the portion lower than the predetermined height H.

Next, the fact that a fixed slim amount can be obtained both at the lower portion and the higher portion than the predetermined height H irrespective of the kind of resist material also in this embodiment will be described with reference to FIG. 14.

Figure 14:
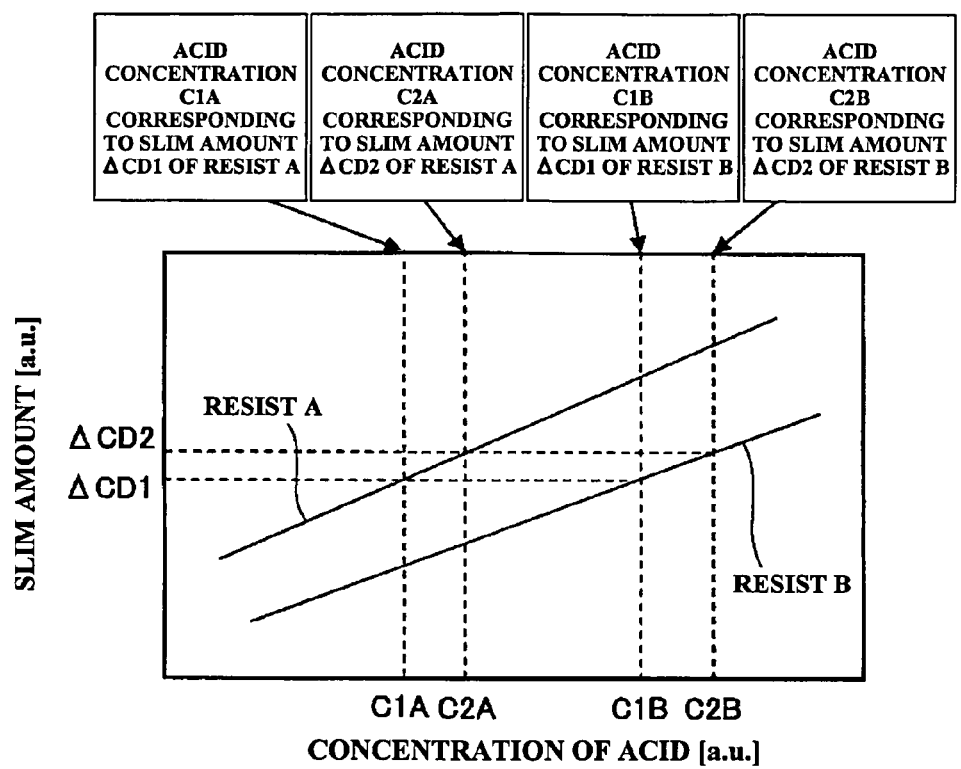
FIG. 14 is a graph for explaining a method of obtaining the concentrations of the acids contained in first and second solutions in the resist pattern slimming treatment method according to the second embodiment of the present invention.

FIG. 14 is a graph for explaining a method of obtaining the concentrations of the acids contained in the first and second solutions in the resist pattern slimming treatment method according to this embodiment.

In the resist pattern slimming treatment method according to this embodiment, when there are variations in slim amount depending on the kind of resist material, the concentration of the acid contained in the solution can be changed to correct the variations. For example, when it is intended to bring the slim amount to ΔCD1 irrespective of the kind of resist material, the concentration of the acid contained in the first solution for the resist A is set to C1A corresponding to the slim amount ΔCD1 of the resist A and the concentration of the acid contained in the first solution for the resist B is set to C1B corresponding to the slim amount ΔCD1 of the resist B as shown in FIG. 14. Further, when it is intended to bring the slim amount to CD2 irrespective of the kind of resist material, the concentration of the acid contained in the second solution for the resist A is set to C2A corresponding to the slim amount ΔCD2 of the resist A and the concentration of the acid contained in the second solution for the resist B is set to C2B corresponding to the slim amount ΔCD2 of the resist B as shown in FIG. 14. As a result, the line widths after the slimming treatment process can be made nearly equal irrespective of the kind of resist material.

Also in the slimming treatment method according to this embodiment, as the method of changing the concentration of the acid contained in the solution, the solution to be used in the slimming treatment process can be selected from among a plurality of kinds of solutions containing acids with concentrations different from each other. By preparing the plurality of kinds of solutions containing acids with different concentrations from each other in advance, the concentration of the acid can be easily changed without performing a process of adjusting the concentration of the acid.

Alternatively, as the method of changing the concentration of the acid contained in the solution, the concentration of the acid may be adjusted by mixing a solvent into the solution containing the acid with a high concentration. It is only necessary to adjust the mixture ratio of mixing the solvent, and therefore it is unnecessary to prepare in advance the plurality of kinds of solutions containing acids with different concentrations. Furthermore, another method may be used to change the concentration of the acid contained in the solution.

Besides, in the resist pattern slimming treatment method according to this embodiment, the second solution containing an acid with a concentration lower than the concentration of the acid contained in the first solution may be applied onto the substrate on which the first solution has been applied. In this case, the line width of the portion of the resist pattern higher than the predetermined height is larger than the line width of the portion of the resist pattern lower than the predetermined height.

Modification Example of Second Embodiment

Next, a resist pattern slimming treatment method and a resist pattern forming method according to a modification example of the second embodiment of the present invention will be described with reference to FIG. 15 to FIG. 18.

First, processes of the resist pattern slimming treatment method according to this modification example will be described with reference to FIG. 15.

FIG. 15 is a flowchart for explaining a procedure of processes of the resist pattern slimming treatment method and the resist pattern forming method according to this modification example.

The slimming treatment method according to this modification example is different from the slimming treatment method according to the second embodiment in that the reaction rate in the heat treatment process is higher in a portion on the lower side than in a portion on the upper side of the resist pattern and the line width of the resist pattern is smaller in the portion on the lower side than in the portion on the upper side, and therefore the resist pattern has a so-called inverse tapered shape.

In the resist pattern slimming treatment method according to the second embodiment, there is little or no difference in reaction rate in the heat treatment process between the portion on the lower side and the portion on the upper side of the resist pattern, and therefore the side surface of the resist pattern is almost vertical to the front surface of the substrate. On the other hand, in the resist pattern slimming treatment method according to the this modification example, the reaction rate in the portion on the lower side of the resist pattern is higher than the reaction rate in the portion on the upper side of the resist pattern, and the line width of the portion on the upper side of the resist pattern is larger than the line width of the portion on the upper side of the resist pattern, so that the side surface of the resist pattern is inclined from the surface almost vertical to the front surface of the substrate, and therefore the resist pattern has an inverse tapered shape.

More specifically, the resist pattern slimming treatment method according to this modification example includes a slimming treatment process of performing a slimming treatment on the resist pattern by applying a first solution containing an acid onto the substrate having a resist pattern formed thereon to an extent of a predetermined height from the front surface of the substrate, then applying a second solution containing an acid with a concentration higher than the concentration of the acid contained in the first solution to the substrate on which the first solution has been applied, then performing a heat treatment, and then performing a developing treatment. Before the slimming treatment process is performed, a database storing kinds of resist material for the resist pattern, concentrations of acid contained in a solution to be applied onto the substrate having the resist pattern formed thereon, and line widths (or slim amounts) at a lower end and line widths (or slim amounts) at an upper end of the resist pattern corresponding to the kinds of resist material and the concentrations of acid is prepared in advance. The concentration of the acid contained in the first solution used in the slimming treatment process is determined based on a concentration of the acid obtained from the database, using, as search keys, the kind of resist material and the target value of the line width (or the slim amount) at the lower end of the resist pattern. The concentration of the acid contained in the second solution used in the slimming treatment process is determined based on a concentration of the acid obtained from the database, using, as search keys, the kind of resist material and the target value of the line width (or the slim amount) at the upper end of the resist pattern.

Note that a coating and developing apparatus performing the resist pattern slimming treatment method according to this modification example is the same as the coating and developing apparatus according to the first embodiment described using FIG. 1 to FIG. 4, and therefore description thereof will be omitted here.

The resist pattern forming method including the resist pattern slimming treatment method according to this modification example includes, as shown in FIG. 15, a resist coating process (Step S31), an exposure process (Step S32), a first development process (Step S33), a second development process (Step S34), an acid concentration determination process (Step S35), and a slimming treatment process (Step S36 to Step S39). Further, the slimming treatment process includes a first acid solution coating process (Step S36), a second acid solution coating process (Step S37), a heat treatment process (Step S38), and a third development process (Step S39).

The processes at Step S31 to Step S34 and Step S36 to Step S39 are the same as the processes at Step S21 to Step S24 and Step S26 to Step S29 shown in FIG. 12 in the second embodiment, respectively. On the other hand, the process at Step S35 is different from the process according to Step S25 shown in FIG. 12 in the second embodiment.

Figure 16A:
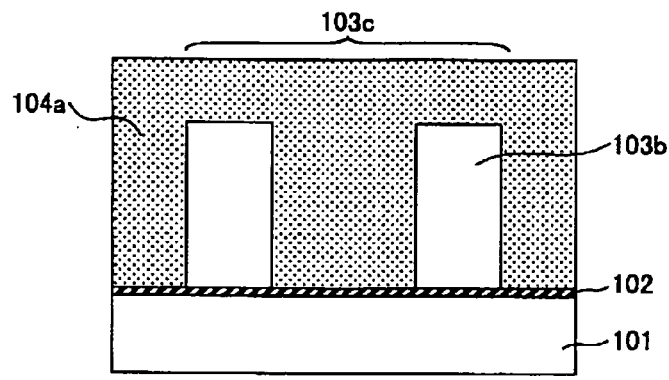
FIG. 16A is a view for explaining a case where the resist pattern subjected to the slimming treatment has an inverse tapered shape.
Figure 16B:
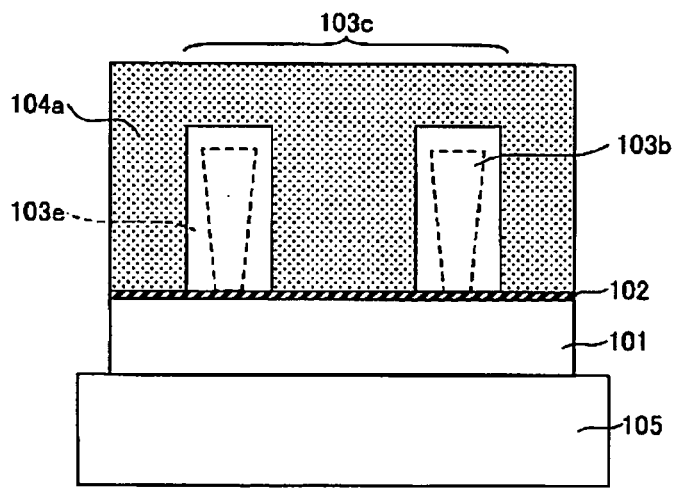
FIG. 16B is a view for explaining the case where the resist pattern subjected to the slimming treatment has the inverse tapered shape.
Figure 16C:
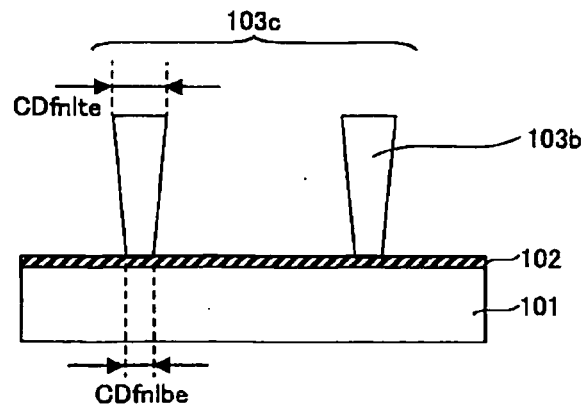
FIG. 16C is a view for explaining the case where the resist pattern subjected to the slimming treatment has the inverse tapered shape.

Next, the fact that the resist pattern sometimes has an inverse tapered shape after the resist pattern slimming treatment method is performed will be described with reference to FIG. 16A to FIG. 16C. FIG. 16A to FIG. 16C are views for explaining the case where the resist pattern subjected to the slimming treatment has the inverse tapered shape. FIG. 16A to FIG. 16C are views respectively showing the structures on the front surface of the substrate after the processes at Step S16 to Step S18 are performed in the first embodiment, and correspond to FIG. 6E to FIG. 6G, respectively.

As shown in FIG. 16A, when performing the heat treatment process at Step S17 after the acid solution coating process at Step S16 is performed, the reactant diffuses faster in the portion on the lower side of the resist pattern 103c. Accordingly, also in the new soluble layer 103e formed on the front surface of the resist pattern 103c, the width of its region is larger in the portion on the lower side as shown in FIG. 16B. As a result, as shown in FIG. 16C, when the third development process at Step S18 is performed, a line width CDfnite at the upper end of the resist pattern 103c after the new soluble layer 103e is removed is different from a line width CDfnlbe at the lower end such as CDfnite>CDfnlbe, and therefore the resist pattern 103c has the inverse tapered shape.

In the case where the resist pattern having such an inverse tapered shape is apt to be formed, the difference between the line width CDfnite at the upper end of the resist pattern and the line width CDfnlbe at the lower end can be reduced by performing the resist pattern slimming treatment method according to this modification example.

Next, the processes at Step S35 to Step S39 will be described with reference to FIG. 17A to FIG. 17D and FIG. 18.

FIG. 17A to FIG. 17D are sectional views each schematically showing the structure on the front surface of the substrate at each step of the resist pattern slimming treatment method according to this modification example. FIG. 17A to FIG. 17D are views respectively showing the structures on the front surface of the substrate after the processes at Step S36 to Step S39 are performed respectively.

In this modification example, the database storing kinds of resist material for the resist pattern, concentrations of acid contained in a solution to be applied onto the substrate having the resist pattern formed thereon, and line widths at the upper end and line widths at the lower end of the resist pattern corresponding to the kinds of resist material and the concentrations of acid is prepared in advance.

Specifically, the pattern forming method composed of the processes at Step S11 to Step S14 and Step S16 to Step S18 in the first embodiment is performed with the material for the resist pattern and the concentration of the acid contained in the solution to be applied onto the substrate changed. Then, the line widths at the upper end and the line width at the lower end of the resist pattern before and after the slimming treatment process are measured, and the slim amount at the upper end and the slim amount at the lower end are calculated from the amount of change in line width before and after the slimming treatment process.

In the acid concentration determination process at Step S35 which is different from the acid concentration determination process at Step S25 in the second embodiment, a concentration of the acid is obtained from the database prepared in advance, using, as search keys, the kind of resist material and the target value of the slim amount (or the line width) at the lower end of the resist pattern, and the concentration of the acid contained in the first solution to be applied onto the substrate in the first acid solution coating process (a first concentration) is determined based on the obtained concentration of the acid. Further, a concentration of the acid is obtained from the database prepared in advance, using, as search keys, the kind of resist material and the target value of the slim amount (or the line width) at the upper end of the resist pattern, and the concentration of the acid contained in the second solution to be applied onto the substrate in the second acid solution coating process (a second concentration) is determined based on the obtained concentration of the acid.

Figure 17A:
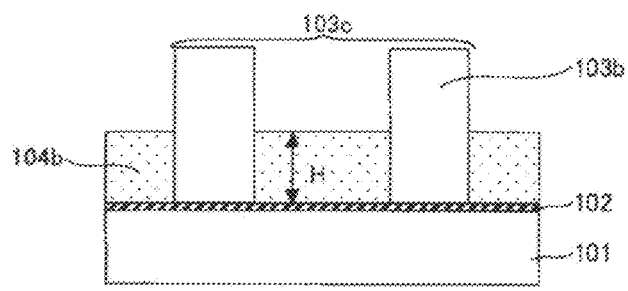
FIG. 17A is a sectional view schematically showing the structure on a front surface of a substrate at one step of the resist pattern slimming treatment method according to the modification example of the second embodiment of the present invention.

In the first acid solution coating process at Step S36, the first solution 104b containing the acid with the first concentration determined in advance is applied onto the substrate having the resist pattern 103c formed thereon. FIG. 17A is a view showing the structure on the front surface of the substrate after the process at Step S36 is performed. The thickness of application of the first solution 104b containing the acid with the first concentration is the predetermined height H from the front surface of the substrate as at Step S26 in the second embodiment.

Figure 17B:
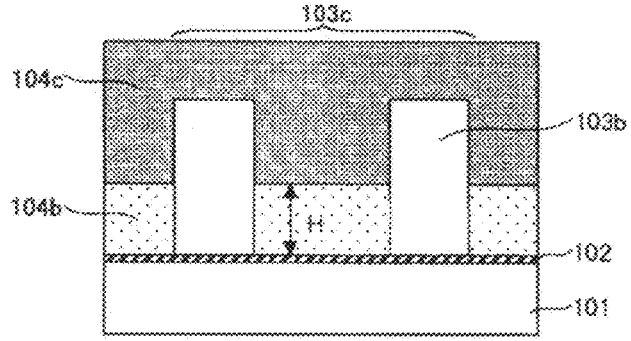
FIG. 17B is a sectional view schematically showing the structure on the front surface of the substrate at one step of the resist pattern slimming treatment method according to the modification example of the second embodiment of the present invention.

In the second acid solution coating process at Step S37, the second solution 104c containing the acid with the second concentration determined in advance is applied onto the substrate on which the first solution 104b has been applied. FIG. 17B is a view showing the structure on the front surface of the substrate after the process at Step S37 is performed. Similarly to Step S27 in the second embodiment, the first solution 104b has been already applied to the extent of the predetermined height H from the front surface of the substrate, and the second solution 104c is applied onto the first solution 104b. In this modification example, the concentration of the acid contained in the second solution 104c can be made higher than the concentration of the acid contained in the first solution 104b.

Figure 17C:
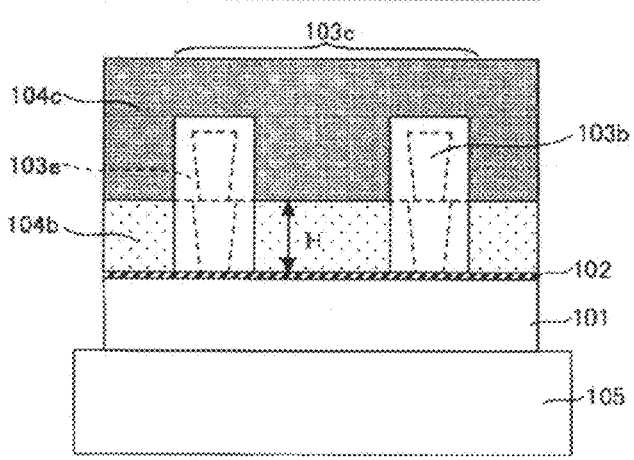
FIG. 17C is a sectional view schematically showing the structure on the front surface of the substrate at one step of the resist pattern slimming treatment method according to the modification example of the second embodiment of the present invention.

The heat treatment process at Step S38 can be performed similarly to Step S28 in the second embodiment. FIG. 17C is a view showing the structure on the front surface of the substrate after the process at Step S38 is performed.

In the portion of the resist pattern 103c lower than the predetermined height H, the reactant diffuses faster in a portion on the lower side of the resist pattern 103c. Accordingly, in the new soluble layer 103e formed on the front surface of the resist pattern 103c, the width of its region is largest at the lower end and the width of its region is smallest near the predetermined height H as shown in FIG. 17C. As a result, in the insoluble layer 103b of the resist pattern, the width of its region is smallest at the lower end and the width of its region is largest near the predetermined height H as shown in FIG. 17C.

Besides, also in the portion of the resist pattern 103c higher than the predetermined height H, the reactant diffuses faster in a portion on the lower side of the resist pattern 103c. Accordingly, in the new soluble layer 103e formed on the front surface of the resist pattern 103c, the width of its region is smallest at the upper end and the width of its region is largest near the predetermined height H as shown in FIG. 17C. As a result, in the insoluble layer 103b of the resist pattern, the width of its region is largest at the upper end and the width of its region is smallest near the predetermined height H as shown in FIG. 17C.

Accordingly, the insoluble layer 103b of the resist pattern has a protruding shape composed of two upper and lower portions each having an inverse tapered shape as shown in FIG. 17C.

Figure 17D:
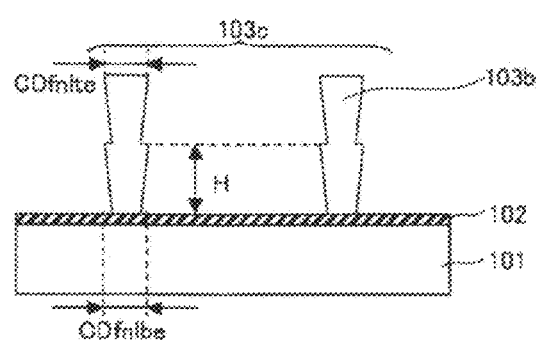
FIG. 17D is a sectional view schematically showing the structure on the front surface of the substrate at one step of the resist pattern slimming treatment method according to the modification example of the second embodiment of the present invention.

The third development process at Step S39 can be performed similarly to Step S29 in the second embodiment. FIG. 17D is a view showing the structure on the front surface of the substrate after the process at Step S39 is performed. The resist pattern 103c after the process at Step S39 is performed has the protruding shape composed of the two upper and lower portions each having an inverse tapered shape as shown in FIG. 17D Next, the fact that the difference between the line width at the upper end and the line width at the lower end of the resist pattern can be reduced in the case where the inverse tapered shape is apt to be formed will be described with reference to FIG. 18.

Figure 18:
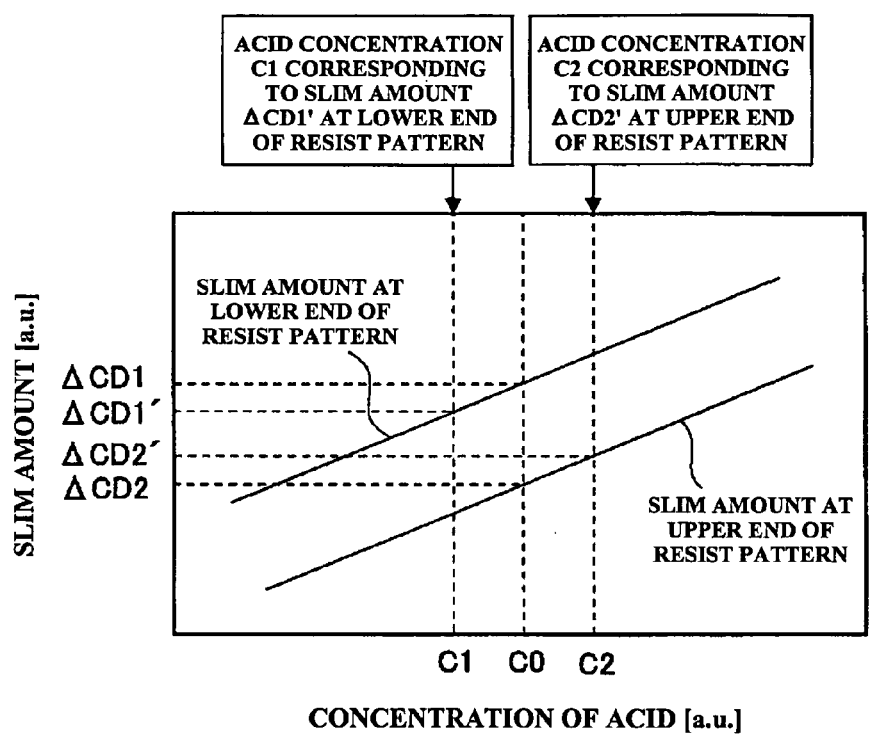
FIG. 18 is a graph for explaining a method of obtaining the concentrations of the acids contained in first and second solutions in the resist pattern slimming treatment method according to the modification example of the second embodiment of the present invention.

FIG. 18 is a graph for explaining a method of obtaining the concentrations of the acids contained in the first and second solutions in the resist pattern slimming treatment method according to this modification example.

In the resist pattern slimming treatment method according to this modification example, when there are variations in slim amount between the upper end and the lower end of the resist pattern, the concentration of the acid contained in the solution can be changed to correct the variations. For example, in the case where the slim amount at the lower end of the resist pattern is $\Delta CD1$ when the concentration of the acid is C0, the slim amount can be brought to $\Delta CD1'$ that is smaller than $\Delta CD1$ by changing the concentration of the acid contained in the first solution to C1 that is lower than C0. Further, in the case where the slim amount at the upper end of the resist pattern is $\Delta CD2$ when the concentration of the acid is C0, the slim amount can be brought to $\Delta CDT$ that is larger than $\Delta CD2$ by changing the concentration of the acid contained in the second solution to C2 that is higher than C0. This results in $\Delta CD2 < \Delta CD2' < \Delta CD1' < \Delta CD1$, and $\Delta CD1' - \Delta CD2' < \Delta CD1 - \Delta CD2$. Accordingly, the difference between the slim amount at the upper end and the slim amount at the lower end of the resist pattern can be made smaller.

Consequently, according to the slimming treatment method according to this modification example, in the case where the resist pattern is apt to be processed into an inverse tapered shape, the difference between the line width at the upper end and the line width at the lower end of the resist pattern can be made smaller by making the concentration of the acid contained in the first solution and the concentration of the acid contained in the second solution different from each other.

Also in the slimming treatment method according to this modification example, as the method of changing the concentration of the acid contained in the solution, the solution to be used in the slimming treatment process can be selected from among a plurality of kinds of solutions containing acids with concentrations different from each other. By preparing the plurality of kinds of solutions containing acids with different concentrations from each other in advance, the concentration of the acid can be easily changed without performing a process of adjusting the concentration of the acid.

Alternatively, as the method of changing the concentration of the acid contained in the solution, the concentration of the acid may be adjusted by mixing a solvent into the solution containing the acid with a high concentration. It is only necessary to adjust the mixture ratio of mixing the solvent, and therefore it is unnecessary to prepare in advance the plurality of kinds of solutions containing acids with different concentrations. Furthermore, another method may be used to change the concentration of the acid contained in the solution.

Note that when the resist pattern has a normal tapered shape in which the line width at the upper end is smaller than the line width at the lower end, the second solution containing an acid with a concentration lower than the concentration of the acid contained in the first solution may be applied onto the substrate on which the first solution has been applied. Also in this case, the difference between the line width at the upper end and the line width at the lower end of the resist pattern can be made smaller by making the concentration of the acid contained in the first solution and the concentration of the acid contained in the second solution different from each other.

Though preferred embodiments of the present invention have been described above, the present invention is not limited to the particular embodiments but can be variously changed and modified within the scope of the invention as set forth in claims.

What is claimed is:

1. A resist pattern slimming treatment method of performing a slimming treatment on a resist pattern formed on a substrate, comprising:

a slimming treatment step of performing a slimming treatment to slim a line width of lines made of resist material in the resist pattern by applying a first solution containing an acid onto the substrate having the resist pattern formed thereon to an extent of a predetermined height from a front surface of the substrate, then applying a second solution containing an acid with a concentration higher than a concentration of the acid contained in the first solution, onto the substrate on which the first solution has been applied, then performing a heat treatment, and then performing a developing treatment, providing a database storing kinds of the resist material for the resist pattern, concentrations of acid contained in a solution to be applied onto the substrate having the resist pattern formed thereon, and line widths of the resist pattern corresponding to the kinds of resist material and the concentrations of acid, inputting a search of the database, using, as search keys, the kind of the resist material and a target value of the line width of the resist pattern, wherein the concentration of the acid contained in the first solution used in said slimming treatment step is selected from the concentration of the acid returned from the database search based on the kind of resist material and the target value of the line width of a portion of the resist pattern lower than the predetermined height from the front surface of the substrate, and wherein the concentration of the acid contained in the second solution used in said slimming treatment step is selected from the concentration of the acid returned from the database search based on the kind of resist material and the target value of the line width of a portion of the resist pattern higher than the predetermined height from the front surface of the substrate.

2. The resist pattern slimming treatment method as set forth in claim 1, wherein the line width of the portion higher than the predetermined height is smaller than the line width of the portion lower than the predetermined height.

3. The resist pattern slimming treatment method as set forth in claim 1, wherein the database is prepared prior to the searching by repeatedly performing the slimming treatment step to the substrate on which the resist pattern formed in of plural different kinds of resist material with the concentration of the acid being changed, and measuring the line widths of the resist pattern after the slimming treatment step; thereafter, obtaining a relation between the concentrations of acid and the line widths of the resist pattern after the slimming treatment step in every kind of resist material, and storing the relation between the concentrations of acid and the line widths of the resist pattern and the resist material in the database.

* * * * *